United States Patent
Youn et al.

(10) Patent No.: US 11,189,673 B2
(45) Date of Patent: Nov. 30, 2021

(54) ORGANIC LIGHT-EMITTING DISPLAY DEVICE HAVING FIRST, SECOND AND THIRD BANK LAYERS AND METHOD OF FABRICATING THE SAME

(71) Applicant: LG Display Co., Ltd., Seoul (KR)

(72) Inventors: Jun-Ho Youn, Paju-si (KR); Sang-Bin Lee, Paju-si (KR); Yun-Joo Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/727,713

(22) Filed: Dec. 26, 2019

(65) Prior Publication Data

US 2020/0212148 A1  Jul. 2, 2020

(30) Foreign Application Priority Data

Dec. 31, 2018 (KR) .................. 10-2018-0173600

(51) Int. Cl.
*H01L 27/32* (2006.01)
(52) U.S. Cl.
CPC ...... *H01L 27/3246* (2013.01); *H01L 27/3262* (2013.01); *H01L 2227/323* (2013.01)

(58) Field of Classification Search
CPC ............ H01L 27/3246; H01L 27/3262; H01L 2227/323
See application file for complete search history.

(56) References Cited

U.S. PATENT DOCUMENTS

2019/0025634 A1* 1/2019 Park .................. G02F 1/133617

FOREIGN PATENT DOCUMENTS

| KR | 10-2016-0113378 A | 9/2016 |
| KR | 10-2018-0029892 A | 3/2018 |

* cited by examiner

*Primary Examiner* — Quoc D Hoang
(74) *Attorney, Agent, or Firm* — Birch, Stewart, Kolasch & Birch, LLP

(57) ABSTRACT

An organic light emitting display device according to an example comprises a substrate; a plurality of first bank layers disposed on the substrate in a first direction and a second direction different from the first direction to define a plurality of pixels; a plurality of second bank layers disposed on the first bank layers in the first direction to partition pixel columns of different colors; and a third bank layer formed in each of the pixel columns in the second direction to divide each of the pixel columns into a plurality of groups each including a plurality of the pixels.

24 Claims, 13 Drawing Sheets

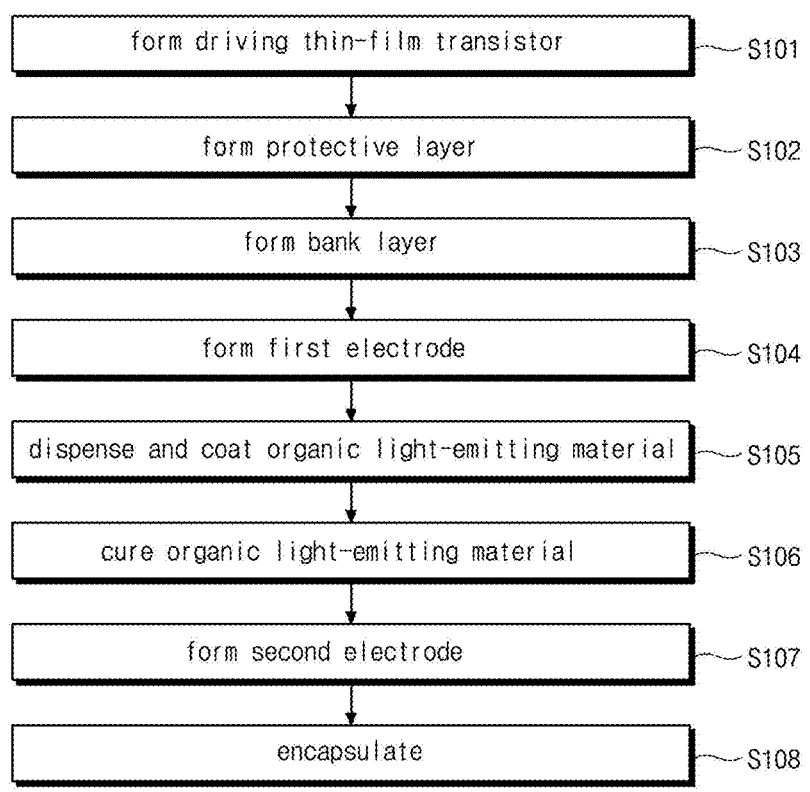

ORGANIC LIGHT-EMITTING DISPLAY DEVICE HAVING FIRST, SECOND AND THIRD BANK LAYERS AND METHOD OF FABRICATING THE SAME

CROSS-REFERENCE TO RELATED APPLICATIONS

This application claims the benefit under 35 U.S.C. § 119(a) of Korean Patent Application No. 10-2018-0173600, filed on Dec. 31, 2018, in the Korean Intellectual Property Office, which is incorporated herein by reference in its entirety into the present application.

BACKGROUND

1. Technical Field

The present disclosure relates to an organic light-emitting display device and a method of fabricating the same, and more particularly, to an organic light-emitting display device having an organic light-emitting layer with a uniform thickness and a method of fabricating the same.

2. Discussion of the Related Art

Recently, various flat panel display devices, which are configured in a thinned shape to significantly reduce weight and volume, have been developed. Among the flat panel display devices, organic light-emitting display devices are self-light emitting devices in which an organic light-emitting layer emits light, and have advantages of fast response speed, high luminous efficiency, high brightness, and a wide viewing angle.

The organic light-emitting layer is made of an organic light-emitting material and is mainly formed by a thermal deposition process, and when the organic light-emitting layer is formed by the thermal deposition process, the following problems occur.

In order to thermally deposit an organic light-emitting material, a metal mask is disposed on the entire surface of a substrate, and the organic light-emitting material is evaporated and deposited on the substrate in a state in which a region other than a display area is blocked to form an organic light-emitting layer. Accordingly, in order to form the organic light-emitting layer, many processes, such as disposing and aligning the metal mask, depositing the organic light-emitting material, and removing the metal mask, are required, which causes a fabricating process to be complicated, a fabricating process to be delayed, and a fabricating cost to be increased.

Further, when the metal mask is misaligned, a defect occurs in the organic light-emitting layer, and thus, a separate alignment device for precisely aligning the metal mask is required. Furthermore, in recent years, as a display device becomes larger, thermal deposition equipment also becomes larger, and such enlargement of the thermal deposition equipment not only increases the fabricating cost but also makes thermal deposition practically impossible in a case in which the display device is made to be extra-large over a certain size.

SUMMARY

An object of the invention is to provide an organic light-emitting display device and a method of fabricating the same capable of preventing an organic light-emitting layer from being formed with a non-uniform thickness due to a variation in the amount of one drop and the aggregation of an organic light-emitting material in a solution state by dividing a pixel column into a plurality of groups each including a plurality of pixels, dispensing the organic light-emitting material into each of the groups, and then spreading the organic light-emitting material in each of the groups.

In order to achieve this and other objects, the organic light emitting display device according to an example of the invention comprises a plurality of first bank layers disposed on a substrate in a first direction and a second direction different from the first direction to define a plurality of pixels; a plurality of second bank layers disposed on the first bank layers in the first direction to partition pixel columns of different colors; and a third bank layer formed in each of the pixel columns in the second direction to divide each of the pixel columns into a plurality of groups each including a plurality of the pixels.

The organic light-emitting display device can further comprise a thin-film transistor formed on the substrate; and a light-emitting element formed on the substrate.

The light-emitting element on the substrate can include a first electrode and a second electrode and an organic light-emitting layer disposed between the first electrode and the second electrode. The organic light-emitting layer is continuously formed between the plurality of pixels within the group and is disconnected between the plurality of groups.

The plurality of the groups formed in each of the pixel columns can include the same number of the pixels, or the plurality of the groups formed in each of the pixel columns can include a different number of the pixels. The number of the pixels included in the group can be increased from an outer periphery of each of the pixel columns toward a central portion of each of the pixel columns and the groups corresponding to the pixel columns of different colors can include different numbers of pixels. The third bank layer of one pixel column can be arranged to be misaligned from the third bank layer of another pixel column adjacent in the second direction.

The first bank layer can be made of a hydrophilic material, the second bank layer can be made of a hydrophobic material, and the third bank layer can be made of a hydrophobic material. Further, the first bank layer can be made of a hydrophilic material, the second bank layer can be made of a hydrophobic material, and the third bank layer can be made of a hydrophilic material.

A height of the third bank layer can be greater than a height of the first bank layer. The height of the third bank layer can be less than a height of the second bank layer. A width of the third bank layer can be less than a width of the second bank layer. The third bank layer can be disposed on the first bank layers in the second direction, and the second bank layer and the third bank layer can be formed to have a smaller width than the first bank layer The organic light-emitting display device can further comprise a dummy region disposed on an outermost portion of the pixel column and including a plurality of dummy pixels. The dummy region can be partitioned from an outermost group by the third bank layer. The dummy region can be partitioned from an outermost group by the first bank layer. A light-emitting element can be not formed and an organic light-emitting layer can be formed in the dummy region.

The sum of the number of the dummy pixels in the dummy region adjacent to an outermost group and the number of the pixels in the outermost group can be equal to the number of pixels of another group. A light-emitting element can be disposed in the dummy region.

A method of fabricating an organic light emitting display device can comprise forming a plurality of first bank layers disposed on a substrate in a first direction and a second direction different from the first direction to define a plurality of pixels, a plurality of second bank layers disposed on the first bank layers in the first direction to partition pixel columns of different colors, and a third bank layer configured to divide each of the pixel columns into a plurality of groups in the second direction; forming a first electrode in the pixel; dispensing an organic light-emitting material in each of the plurality of groups in each of the pixel columns and allowing the organic light-emitting material to spread over the entire region of each of the plurality of groups; and drying the organic light-emitting material to form an organic light-emitting layer.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

FIG. 4 is a flowchart illustrating a method of fabricating the organic light-emitting display device according to an example of the present disclosure.

DETAILED DESCRIPTION

Hereinafter, the present disclosure will be described in detail with reference to the accompanying drawings.

In order to form an organic light-emitting layer of an organic light-emitting display device, a coating method other than a thermal deposition method is used in the present disclosure. For example, the organic light-emitting layer can be formed by dispensing an organic light-emitting material on a set region on a substrate and then allowing the dispensed organic light-emitting material to spread on the substrate. Accordingly, compared to forming an organic light-emitting layer by a thermal deposition process, the coating method can simplify a fabricating process, can be performed quickly, and can also be usefully applied to a display device having a large area.

In the present disclosure, the organic light-emitting layer is formed by arranging pixels of the same color in a longitudinal direction in a strip manner, dividing each of pixel columns of the same color into a plurality of groups, and dispensing the organic light-emitting material in one region of each divided group such that the organic light-emitting material is coated on the entire region of the corresponding group. Accordingly, since the organic light-emitting layer is formed by dispensing the organic light-emitting material in a solution state in each of a plurality of groups, the thickness non-uniformity of the organic light-emitting layer due to a variation in the amount of one drop can be solved. In addition, since the organic light-emitting material is spread in the divided region instead of the entire pixel column, the thickness non-uniformity of the organic light-emitting layer can be solved by reducing the stress of the organic light-emitting material coated in the group.

Figure 1:
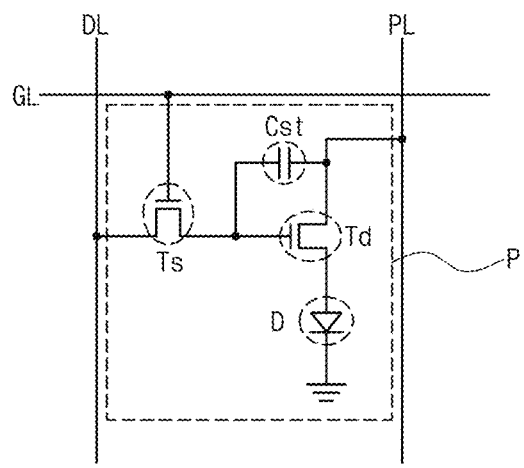
FIG. 1 is a schematic circuit diagram of one pixel of an organic light-emitting display device according to one or more embodiments of the present disclosure.

FIG. 1 is a schematic circuit diagram of one pixel P of an organic light-emitting display device according to an example of the present disclosure. All the components of the organic light-emitting display device according to all embodiments of the present disclosure are operatively coupled and configured.

As illustrated in FIG. 1, the organic light-emitting display device according to the present disclosure includes a gate line GL, a data line DL, and a power line PL that cross each other to define a pixel P, and in the pixel P, a switching thin-film transistor Ts, a driving thin-film transistor Td, a storage capacitor Cst, and an organic light-emitting element D are disposed. The display device includes a plurality of the pixels P.

The switching thin-film transistor Ts is connected to the gate line GL and the data line DL, the driving thin-film transistor Td and the storage capacitor Cst are connected between the switching thin-film transistor Ts and the power line PL, and the organic light-emitting element D is connected to the driving thin-film transistor Td.

In the organic light-emitting display device having such a structure, when the switching thin-film transistor Ts is turned on in response to a gate signal applied through the gate line GL, a data signal applied through the data line DL is applied to a gate electrode of the driving thin-film transistor Td and one electrode of the storage capacitor Cst through the switching thin-film transistor Ts.

The driving thin-film transistor Td is turned on in response to a data signal applied to the gate electrode thereof, and as a result, a current proportional to the data signal flows from the power line PL to the organic light-emitting element D through the driving thin-film transistor Td, and the organic light-emitting element D emits light with a luminance proportional to the current flowing through the driving thin-film transistor Td.

Here, the storage capacitor Cst is charged with a voltage proportional to the data signal so that the voltage of the gate electrode of the driving thin-film transistor Td is maintained to be constant for one frame.

Figure 2:
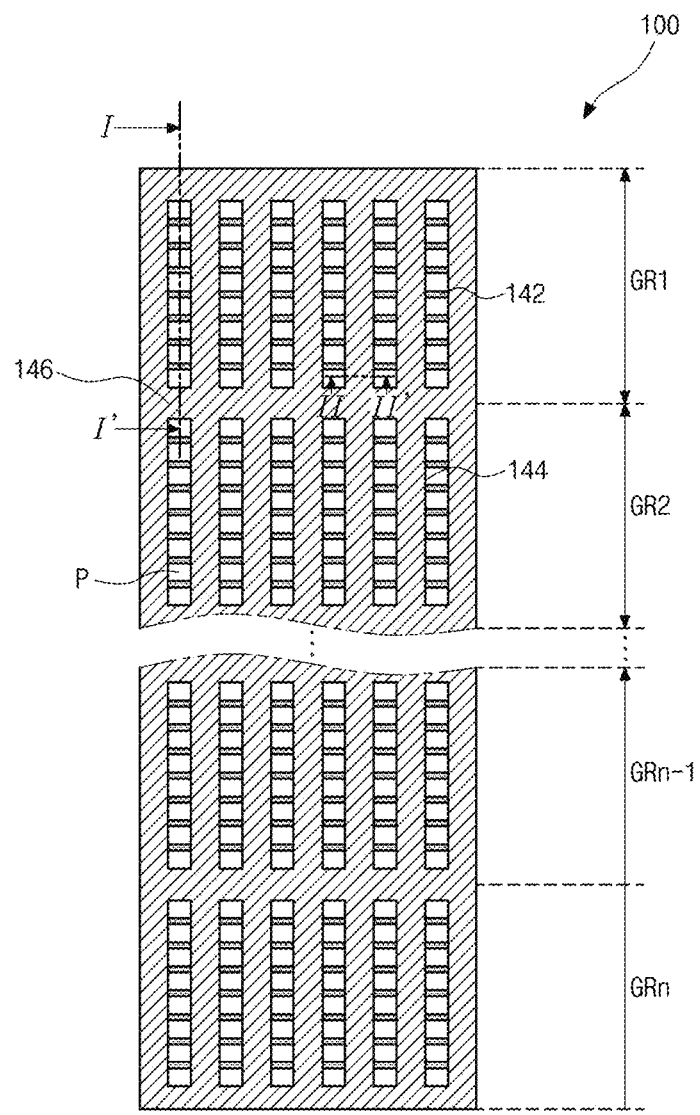
FIG. 2 is a plan view schematically illustrating a structure of an organic light-emitting display device according to a first embodiment of the present disclosure.

FIG. 2 is a plan view schematically illustrating a structure of an organic light-emitting display device 100 according to a first embodiment of the present disclosure.

As illustrated in FIG. 2, a plurality of red (R) pixels, a plurality of green (G) pixels, and a plurality of blue (B) pixels are arranged in the organic light-emitting display device 100 according to the first embodiment of the present disclosure, and an R-organic light-emitting layer, a G-organic light-emitting layer, and a B-organic light-emitting layer are formed in the R pixel, the G pixel, and the B pixel, respectively. Here, the R pixels, the G pixels, and the B pixels are arranged in a strip manner, and the plurality of R pixels, the plurality of G pixels, and the plurality of B pixels are each arranged in the longitudinal direction. Specifically, the R pixels, the G pixels or the B pixels of the same color are arranged in the longitudinal direction of the organic light-emitting display device 100, and the R pixels, the G pixels and the B pixels of different colors are alternately arranged in a transverse direction of the organic light-emitting display device 100, for example, arranged in the order of R-G-B-R-G-B. However, the R pixels, the G pixels and the B pixels may not be arranged in this order but can be arranged in a different order. Further, a white pixel W may be included.

A first bank layer 142 is formed at an outer periphery of each of the R pixels, the G pixels, and the B pixels so that each of all of the R pixels, the G pixels, and the B pixels is partitioned from the other pixels. For example, the first bank layer 142 defines one pixel in which one organic light-emitting element of the organic light-emitting display device is provided.

Second bank layers 144 are disposed in boundaries between R-, G-, and B-pixel columns arranged in the longitudinal direction and disposed in an outermost region of the organic light-emitting display device 100. Since the pixels of the same color are arranged in the longitudinal direction in a strip shape to form one pixel column, the second bank layers 144 are disposed in boundaries between pixel columns of different colors, thereby partitioning the pixel columns of different colors.

Although the first bank layers 142 are formed in boundaries between the pixels of the same color, which are arranged along the pixel column, to partition adjacent pixels of the same color, the organic light-emitting layer of the corresponding color is formed over the entire pixels arranged within the corresponding pixel column beyond the first bank layers 142. The second bank layers 144 are formed in boundaries between the pixels of different colors to prevent the organic light-emitting materials of different colors from being mixed in the organic light-emitting layer formed in the corresponding pixel.

Each of the plurality of pixel columns is partitioned into a plurality of groups GR1, GR2, . . . , and GRn, and third bank layers 146 are formed in boundaries between the groups GR1, GR2, . . . , and GRn. For example, n−1 (where n is a natural number greater than 1) third bank layers 146 are formed in one pixel column to divide one pixel column into n groups.

The third bank layer 146 divides the organic light-emitting layer formed in each of the plurality of groups GR1, GR2, . . . , and GRn adjacent to each other. For example, the organic light-emitting layer having the same color is formed in the entire pixel column, and the organic light-emitting layer is continuously formed in a plurality of pixels, which are arranged in each of the groups GR1, GR2, . . . , and GRn, beyond the first bank layers 142, but the organic light-emitting layers are formed to be disconnected from each other between adjacent groups GR1, GR2, . . . , and GRn.

As described above, in the present disclosure, the organic light-emitting layer is formed in each of the groups GR1, GR2, . . . , and GRn to be disconnected (or discontinuous) from the organic light-emitting layers of the other adjacent groups GR1, GR2, . . . , and GRn by arranging the plurality of third bank layers 146 in each of the pixel columns, dividing each of the pixel columns into the plurality of groups GR1, GR2, . . . , and GRn, and dispensing the organic light-emitting material in each of the groups GR1, GR2, . . . , and GRn and then allowing the dispensed organic light-emitting material to spread in each of the groups GR1, GR2, . . . , and GRn. For example, the organic light-emitting layer having a uniform thickness can be formed over the entire pixel column by dispensing the organic light-emitting material in a solution state for each of the groups GR1, GR2, . . . , and GRn to form the organic light-emitting layer in the corresponding group of the groups GR1, GR2, and GRn, and this will be described below in detail.

Figure 3A:
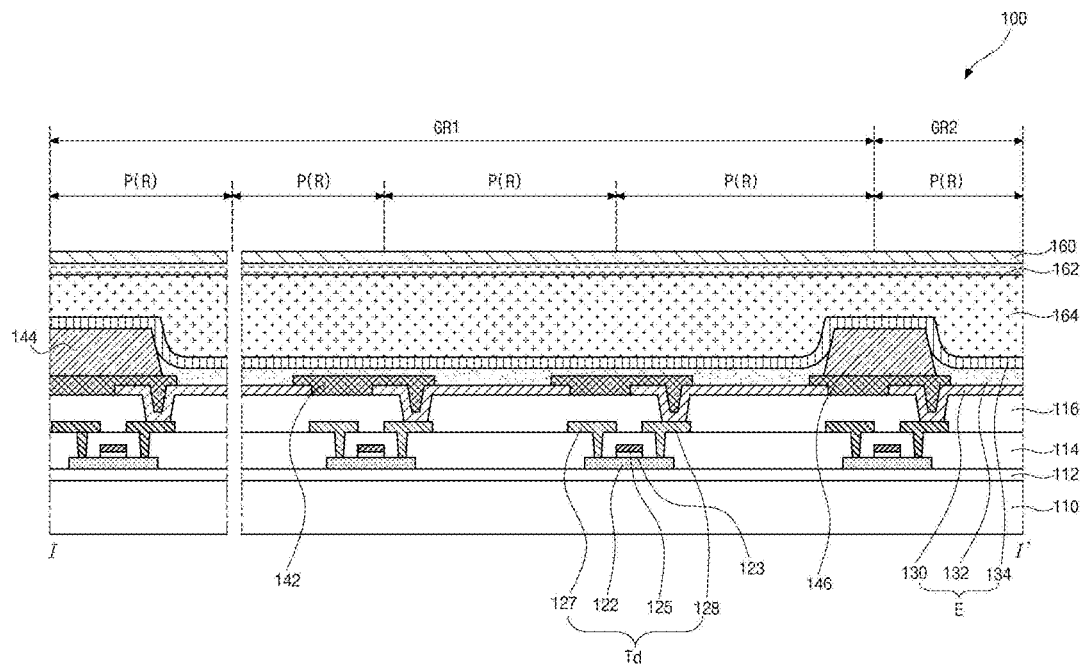
FIGS. 3A and 3B are cross-sectional views taken along line I-I' and line II-II' of FIG. 2, respectively.
Figure 3B:
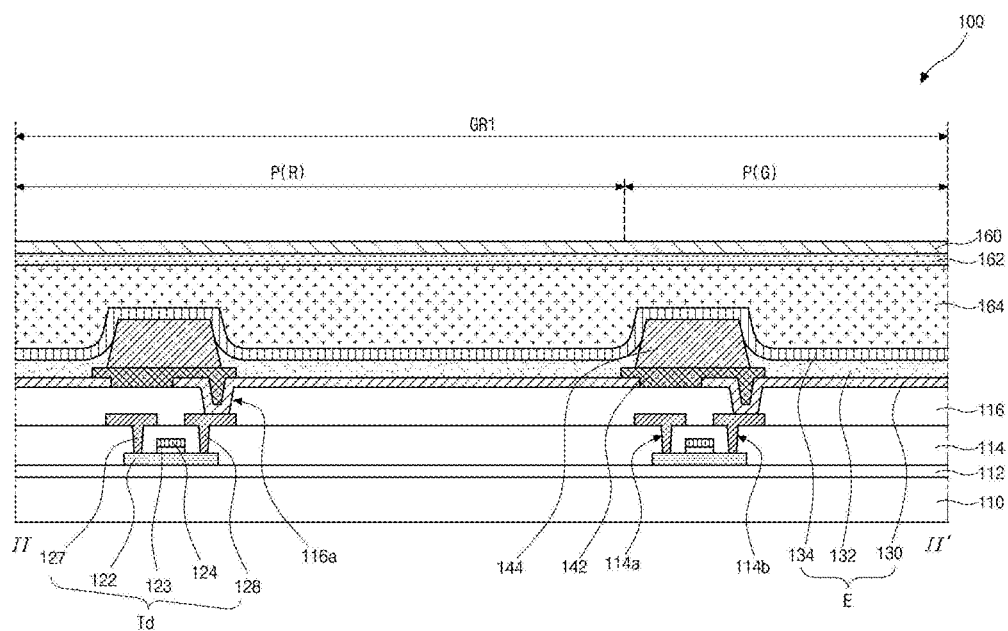

FIGS. 3A and 3B are cross-sectional views taken along line I-I' and line II-II' of FIG. 2, respectively, and with reference to these, the organic light-emitting display device 100 according to one embodiment of the present disclosure will be described in more detail. Here, the structure of the R-pixels adjacent to each other in the longitudinal direction (that is, a pixel column direction) and the structure of the R-pixel and the G-pixel adjacent to each other in a transverse direction are only illustrated in the drawings. However, since all of the R, G, and B pixels of the present embodiment are formed in the same structure as those pixels described above, the structure of the entire organic light-emitting display device 100 is described by describing those structures described above.

As illustrated in FIGS. 3A and 3B, a buffer layer 112 is entirely formed on a first substrate 110 on which a first group GR1 and a second group GR2, each of which is arranged in the pixel column direction and includes a plurality of pixels P(R), are formed, and the driving thin-film transistor Td is disposed in each of the pixels on the buffer layer 112.

The first substrate 110 can be made of a transparent material such as glass or can be made of a transparent and flexible plastic such as polyimide. In addition, the buffer layer 112 can be formed as a single layer or a plurality of layers made of an inorganic material such as SiOx or SiNx.

The driving thin-film transistor Td is formed in each of the plurality of pixels P(R). The driving thin-film transistor Td includes a semiconductor layer 122 formed in the pixel on the buffer layer 112, a gate insulating layer 123 formed in a partial region of the semiconductor layer 122, a gate electrode 125 formed on the gate insulating layer 123, an interlayer insulating layer 114 formed over the entire first substrate 110 to cover the gate electrode 125, and a source electrode 127 and a drain electrode 128 that are in contact with the semiconductor layer 122 through first and second contact holes 114a and 114b formed in the interlayer insulating layer 114.

Further, a switching thin-film transistor can be disposed on the first substrate 110, and the switching thin-film transistor can have the same structure as the driving thin-film transistor Td.

The semiconductor layer 122 can be formed of crystalline silicon or an oxide semiconductor such as indium gallium zinc oxide (IGZO) and include a channel layer in a central region thereof and a doped layer on both side surfaces thereof so that the source electrode 127 and the drain electrode 128 are in contact with the doped layer.

The gate electrode 125 can be made of a metal such as Cr, Mo, Ta, Cu, Ti, Al, or an Al alloy, and the gate insulating layer 123 and the interlayer insulating layer 114 can be formed as a single layer made of an inorganic material such as SiOx or SiNx or an inorganic layer having a two-layer structure of SiOx and SiNx. The gate insulating layer 123 is illustrated in the drawings as being disposed only below the gate electrode 125 but can be formed over the entire first substrate 110.

The source electrode 127 and the drain electrode 128 can be made of Cr, Mo, Ta, Cu, Ti, Al, or an Al alloy, but the present disclosure is not limited thereto.

In addition, in the drawings and the above description, the driving thin-film transistor Td is described as being formed in a specific structure, but the driving thin-film transistor Td of the present disclosure is not limited to the illustrated structure, and a driving thin-film transistor of any structure can be applied.

A protective layer 116 is formed above the first substrate 110 above which the driving thin-film transistor Td is formed. The protective layer 116 can be made of an organic material such as photo acryl but can also be formed as a plurality of layers of an inorganic layer and an organic layer. A contact hole 116a is formed in the protective layer 116.

A first electrode 130 is formed on the protective layer 116 and is electrically connected to the drain electrode 128 of the driving thin-film transistor Td through the contact hole 116a. In addition, the first electrode 130 is formed as a single layer or a plurality of layers made of a metal such as Ca, Ba, Mg, Al, or Ag, or an alloy thereof, and is connected to the drain electrode 128 of the driving thin-film transistor Td so that an image signal from the outside is applied to the first electrode 130.

The first bank layer 142 is formed on the protective layer 116 at a boundary between all of the pixels P(R), and pixels P(G), and the second bank layer 144 is formed in a boundary between pixels of different colors, that is, on the first bank layer 142 between an R-pixel P(R) and a G-pixel P(G). In addition, the second bank layer 144 is also formed on the first bank layer 142 in an outermost region of the pixel column, that is, an outer periphery region of the first group GR1 and an outer periphery region of the n-th group GRn. The third bank layer 146 is formed on the first bank layer 142 between the group GR1 and the group GR2 of the same pixels P(R).

The first bank layer 142, the second bank layer 144, and the third bank layer 146 are a kind of partition walls. The first bank layer 142 electrically partitions each pixel from the other pixels so that an image signal different from those of other pixels is input to each pixel, causing each pixel to display an image corresponding to the corresponding pixel. In addition, the second bank layer 144 can partition the pixels of different colors to prevent light of a specific color output from adjacent pixels from being mixed and output. In addition, the third bank layer 146 partitions the pixels of the same color into a set number of groups such that the organic light-emitting layer is continuously formed in the pixels included in the corresponding group.

As shown, the first bank layer 142 is formed on the protective layer 116, and the second bank layer 144 and the third bank layer 146 are formed on the first bank layer 142. In addition, the second bank layer 144 and the third bank layer 146 are formed to have a smaller width than the first bank layer 142 so that both sides of an upper surface (i.e., the portion of the upper surface extending from both side surfaces of each of the second bank layer 144 and the third bank layer 146) of the first bank layer 142 are exposed to the outside. Here, a height of the third bank layer 146 can be greater than that of the first bank layer 142. The height of the third bank layer 146 can be less than that of the second bank layer 144. In addition, a width of an upper surface of the third bank layer 146 can be less than a width of an upper surface of the second bank layer 144.

The second bank layer 144 and the third bank layer 146 can be formed separately by different processes but can be also integrally formed by the same process.

An organic light-emitting element E is formed on the protective layer 116 in the region partitioned by the first bank layer 142 and is connected to the drain electrode 128 of the driving thin-film transistor Td through the contact hole 116a formed in the protective layer 116.

The organic light-emitting element E includes the first electrode 130 connected to the drain electrode 128 of the driving thin-film transistor Td through the contact hole 116a, an organic light-emitting layer 132 formed on the first electrode 130, and a second electrode 134 formed on the organic light-emitting layer 132.

The first electrode 130 is formed as a single layer or a plurality of layers made of a metal such as Ca, Ba, Mg, Al, or Ag, or an alloy thereof, and is connected to the drain electrode 128 of the driving thin-film transistor Td so that an image signal from the outside is applied to the first electrode 130. Here, the first electrode 130 can act as a reflective film to reflect light emitted from the organic light-emitting layer 132 in an upward direction (i.e., in a direction away from the first substrate 110). In addition, the first electrode 130 can be made of a transparent metal oxide such as indium tin oxide (ITO) or indium zinc oxide (IZO).

The second electrode 134 is made of a transparent metal oxide such as ITO or IZO, but the present disclosure is not limited thereto. In addition, the second electrode 134 can be formed as a single layer or a plurality of layers made of a metal such as Ca, Ba, Mg, Al, or Ag, or an alloy thereof. Here, the second electrode 134 can act as a reflective film to reflect the light emitted from the organic light-emitting layer 132 in a downward direction (i.e., in a direction towards the first substrate 110).

When the organic light-emitting display device 100 according to the present disclosure is a bottom emission display device in which light emitted from the organic light-emitting layer 132 is output in the downward direction, that is, toward the first substrate 110, the first electrode 130 is made of a transparent metal oxide and the second electrode 134 is made of a metal or a metal compound that reflects light, and when the organic light-emitting display device 100 is a top emission display device in which light emitted from the organic light-emitting layer 132 is output in the upward direction, the first electrode 130 is made of a metal or a metal compound that serves as a reflective film and the second electrode 134 is made of a transparent metal oxide.

The organic light-emitting layer 132 can be one of the R-organic light-emitting layer, the G-organic light-emitting layer, and the B-organic light-emitting layer, which are formed in the R, G, and B pixels to emit red light, green light, and blue light, respectively, and can be a white organic light-emitting layer that is formed over the entire display device to emit white light. When the organic light-emitting layer 132 is the white organic light-emitting layer, R, G, and B color filter layers are formed in an upper region of the white organic light-emitting layer of the R, G, and B pixels to convert white light emitted from the white organic light-emitting layer into red light, green light, and blue light. The white organic light-emitting layer can be formed by mixing a plurality of organic materials each emitting one of red, blue, and green monochromatic lights, or can be formed by stacking a plurality of organic light-emitting layers each emitting one of the red, blue, and green monochromatic lights.

The organic light-emitting layer can be an inorganic light-emitting layer made of an inorganic light-emitting material, for example, a quantum dot or the like, rather than the organic light-emitting material.

The organic light-emitting layer 132 can include a light-emitting layer, an electron injection layer and a hole injection layer that inject electrons and holes into the light-emitting layer, respectively, and an electron transport layer and a hole transport layer that transport the injected electrons and holes to the light-emitting layer, respectively.

The first electrode 130 is formed to be spaced apart from the first bank layer 142 by a predetermined distance. However, the first electrode 130 can also be formed on the protective layer 116 on which the first bank layer 142 is formed, and thus the first bank layer 142 can be formed on the first electrode 130.

As described in detail below, the organic light-emitting layer 132 may not be formed by a thermal deposition method and can be formed by coating the organic light-emitting material in a solution state on the first electrode 130, followed by drying. The organic light-emitting layer 132 can be the R-organic light-emitting layer, the G-organic light-emitting layer, and the B-organic light-emitting layer, which are formed in the R, G, and B pixels to emit red light, green light, and blue light, respectively.

Although described below, the organic light-emitting layer 132 is illustrated in the drawings as being formed on one pixel P, but in practice, the organic light-emitting layer 132 is formed over a plurality of identical pixels P arranged in a strip shape from one side of the display device to the other side of the display device.

Accordingly, the organic light-emitting layer 132 is not formed with a constant thickness in the plurality of pixels P and has a variation in thickness between an outer periphery region and a central region of the display device. The reason for such a thickness variation is that the organic light-emitting layer 132 is formed by coating and drying, rather than by a thermal deposition method.

For example, when the organic light-emitting material in a solution state is coated and dried, a solvent in the organic light-emitting material evaporates and the organic light-emitting material remains, and in this case, the evaporation rate of the solvent in the outer periphery region of the display device is greater than that in the central region of the display device so that the organic light-emitting material in the outer periphery region of the display device is dried first. Accordingly, a portion of the organic light-emitting material in the undried central region is spread to the outer periphery region to generate a thickness variation between the outer periphery region and the central region of the display device.

Here, as illustrated in FIG. 3A, the first bank layer 142 is formed in a boundary between the plurality of pixels P(R) of the same color arranged in the pixel column in a strip shape to partition each of the pixels P(R), and the third bank layer 146 is disposed in the column of the plurality of pixels P(R) of the same color arranged in a strip shape to separate the pixel column in a strip shape into a plurality of groups GR1 and GR2.

In addition, as illustrated in FIG. 3B, the first bank layer 142 is formed at the boundary between all of the pixels P to define an area of the pixel P, and the second bank layer 144 is disposed in a boundary between the pixel P(R) and the pixel P(G) of different colors to partition the pixel P(R) and the pixel P(G) of different colors. Accordingly, the organic light-emitting layers 132 of different colors are formed with the second bank layer 144 interposed therebetween, and the second bank layer 144 prevents the organic light-emitting materials of different colors from being mixed when the organic light-emitting layers 132 are formed.

Accordingly, although the organic light-emitting layers 132 of the same color are formed with the third bank layer 146 interposed therebetween, the organic light-emitting layer 132 of the same color in the pixel column is continuously formed beyond the boundary between the pixels P(R), that is the first bank layer 142, in each of the groups GR1 and GR2, but is disconnected by the third bank layer 146 and formed discontinuously in a boundary between the group GR1 and the group GR2. In particular, the third bank layer 146 allows the organic light-emitting layer 132 to be formed with a uniform thickness over the plurality of pixels P arranged in the pixel column by disconnecting the organic light-emitting layer 132 at the boundary between the group GR1 and the group GR2.

An encapsulation layer 164 is formed on the second electrode 134. The encapsulation layer 164 can be formed as a single layer of an inorganic layer, can be formed as two layers of an inorganic layer/an organic layer, or can be formed as three layers of an inorganic layer/an organic layer/an inorganic layer. The inorganic layer can be made of an inorganic material such as SiNx and SiX, but the present disclosure is not limited thereto. In addition, the organic layer can be made of an organic material such as polyethylene terephthalate, polyethylene naphthalate, polycarbonate, polyimide, polyethylenesulfonate, polyoxymethylene, polyarylate, or a mixture thereof, but the present disclosure is not limited thereto.

An adhesive layer 162 is coated on the encapsulation layer 164 and a second substrate 160 is disposed on the adhesive layer 162, and thus the second substrate 160 is attached to the display device. In addition, at least one layer of encapsulant is provided above the organic light-emitting element E to encapsulate the organic light-emitting element E so that it is possible to prevent impurities such as air and moisture from penetrating into the organic light-emitting element E and, as a result, deterioration of the organic light-emitting element E and causing the organic light-emitting element E to be defective can be prevented.

The encapsulant can be formed as one layer of inorganic encapsulation layer or can be formed as a plurality of layers of an inorganic encapsulation layer/an organic encapsulation layer/an inorganic encapsulation layer. The inorganic encapsulation layer can be made of an inorganic material such as SiNx and Six, but the present disclosure is not limited thereto. In addition, as the organic encapsulation layer, an organic material such as polyethylene terephthalate, polyethylene naphthalate, polycarbonate, polyimide, polyethylenesulfonate, polyoxymethylene, polyarylate, or a mixture thereof can be used, but the present disclosure is not limited thereto.

Any material can be used as the adhesive layer 162 as long as the material has high adhesion, heat resistance, and water resistance, but in the present disclosure, a thermosetting resin such as an epoxy-based compound, an acrylate-based compound, or an acrylic-based rubber can be used. In addition, a photocurable resin can be used as an adhesive, and in this case, the adhesive layer 162 is cured by irradiating light such as ultraviolet rays thereto.

The adhesive layer 162 may not only bond the first substrate 110 and the second substrate 160 but also serve as an encapsulant for preventing moisture from penetrating into the organic light-emitting display device 100. Accordingly, although the reference numeral "162" is expressed as the adhesive layer in the detailed description of the present disclosure, this is for the convenience of description, and the adhesive layer can also be referred to as another encapsulation layer.

As the second substrate 160 serving as an encapsulation cap for encapsulating the organic light-emitting display device 100, a protection film such as a polystyrene (PS) film, a polyethylene (PE) film, a polyethylene naphthalate (PEN) film, or a polyimide (PI) film, or glass can be used.

The first electrode 130, the organic light-emitting layer 132, and the second electrode 134 form the organic light-emitting element. The first electrode 130 is a cathode of the organic light-emitting element and the second electrode 134 is an anode of the organic light-emitting element, and when a voltage is applied to the first electrode 130 and the second electrode 134, electrons are injected into the organic light-emitting layer 132 from the first electrode 130 and holes are injected into the organic light-emitting layer 132 from the second electrode 134 so that excitons are generated in the organic light-emitting layer 132, and as the excitons decay, light corresponding to an energy difference between lowest unoccupied molecular orbital (LUMO) and highest occupied molecular orbital (HOMO) of the light-emitting layer is generated and emitted to the outside.

As described above, in the organic light-emitting display device 100 according to the present disclosure, the organic light-emitting layer 132, which is formed in the pixel column, can be formed to have a uniform thickness by forming at least one third bank layer 146 in the pixel column in which pixels of the same color are arranged in a strip shape to divide the pixel column into the plurality of groups GR1, GR2, . . . , and GRn.

FIG. 4 is a flowchart illustrating a method of fabricating the organic light-emitting display device 100 according to an example of the present disclosure.

As illustrated in FIG. 4, initially, the buffer layer 112 is formed on the first substrate 110, and then the driving thin-film transistor Td composed of the semiconductor layer 122, the gate insulating layer 123, the gate electrode 125, the interlayer insulating layer 114, the source electrode 127, and the drain electrode 128 is formed on the buffer layer 112 (S101).

Subsequently, the protective layer 116 is formed by stacking an organic material such as photoacryl over the entire first substrate 110 on which the driving thin-film transistor Td is formed (S102), and then the first bank layer 142, the second bank layer 144, and the third bank layer 146 are formed on the protective layer 116 (S103).

Here, the first bank layers 142 are formed in the transverse direction and in the longitudinal direction of the first substrate 110 and disposed along the periphery of each of all the pixels P of the organic light-emitting display device 100, thereby partitioning each of all the pixels P from the other pixels P. The second bank layer 144 is formed along the outer periphery of the first substrate 110 to separate the pixels from the outer periphery region and is formed along the longitudinal direction of the first substrate 110 to partition the pixels P of the same color from the pixels P of other colors. In addition, the third bank layer 146 is disposed in a boundary between the pixels of the pixel column in the longitudinal direction of the first substrate 110 to divide the pixel column into a plurality of groups.

Subsequently, the first electrode 130 is formed in each of the pixels defined by the first bank layer 142 (S104), and then the organic light-emitting material is coated and cured to form the organic light-emitting layer 132 (S105 and S106).

Here, the first electrode 130 is formed in units of the first bank layer 142, that is, in pixel units, so that the first electrodes 130 are separated from each other at a boundary between adjacent pixels, but the organic light-emitting layer 132 is formed in units of the second bank layer 144 and the third bank layer 146, that is, in the unit of the group formed in the pixel column, so that the organic light-emitting layer 132 is continuously formed in the plurality of pixels arranged in the longitudinal direction but is disconnected at a boundary between the groups.

Thereafter, the organic light-emitting display device 100 is completed by forming the second electrode 134 on the organic light-emitting layer 132 and then encapsulating the organic light-emitting display device 100 (S107 and S108).

As described above, in the organic light-emitting display device 100 according to the present disclosure, the organic light-emitting layer 132 is formed by coating the organic light-emitting material in the group divided by the first bank layer 142, the second bank layer 144, and the third bank layer 146, followed by drying (or curing), and a method of coating the organic light-emitting material will be described with reference to FIG. 5.

Figure 5:
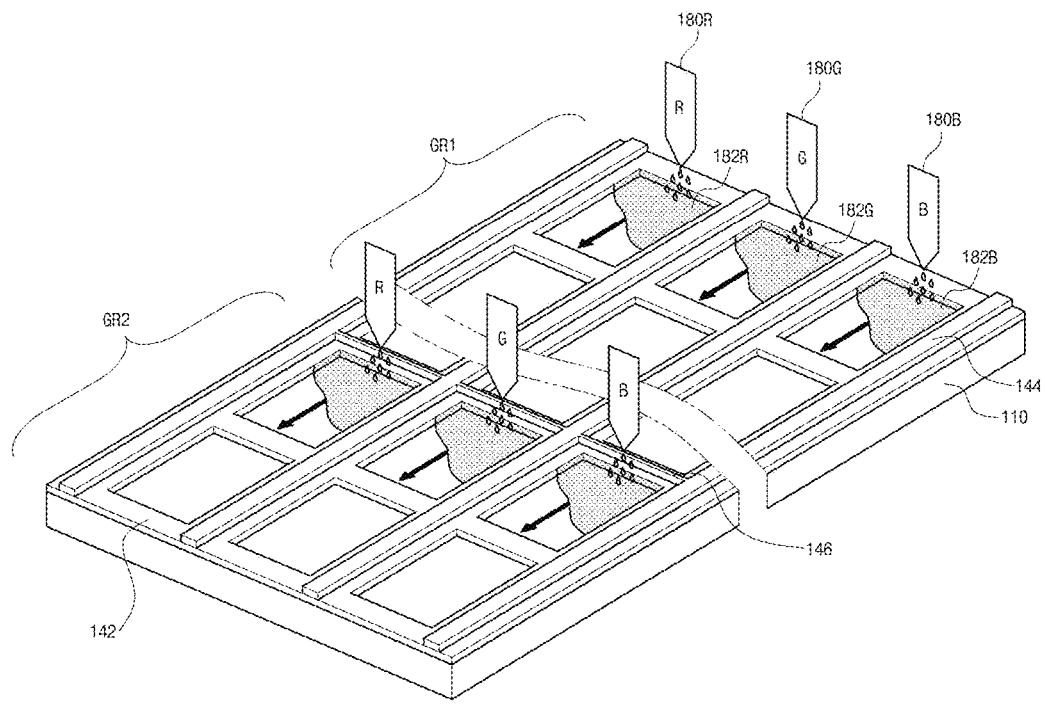
FIG. 5 is a view illustrating a method of coating an organic light-emitting material in the organic light-emitting display device according to an example of the present disclosure.

FIG. 5 is a view illustrating the method of coating the organic light-emitting material in the organic light-emitting display device according to the present disclosure. Here, for the convenience of description, only the first bank layer 142, the second bank layer 144, and the third bank layer 146 are illustrated on the first substrate 110, and other components such as the thin-film transistor are omitted.

As illustrated in FIG. 5, the plurality of R pixels, the plurality of G pixels, and the plurality of B pixels are formed on the first substrate 110, and the pixels of the same color are arranged in a strip shape in a first direction (i.e., in the longitudinal direction) of the first substrate 110, and the pixels of different colors are alternately (R-G-B-R-G-B) arranged in a strip shape in a second direction (i.e., in the transverse direction) different from the first direction of the first substrate 110.

The first bank layers 142 are formed in the first and second directions of the first substrate 110 to surround all of the R, G, and B pixels, and the second bank layers 144 are formed on the first bank layer 142 in the first direction and are disposed in boundaries between pixels of different colors, that is, between an R-pixel column and a G-pixel column, between the G-pixel column and a B-pixel column, and between the B-pixel column and the R-pixel column. In addition, the plurality of third bank layers 146 are formed on the first bank layers 142 in the second direction in each of the R-pixel column, the G-pixel column, and the B-pixel column, so that each of the R-pixel column, the G-pixel column, and B-pixel column is divided into a plurality of groups GR1, GR2, . . . , and GRn. Here, each of the groups GR1, GR2, . . . , and GRn includes a plurality of pixels of corresponding colors.

At this point, the second bank layer 144 and the third bank layer 146 are integrally formed with the same material but can be also formed separately with different materials (however all of the materials have hydrophobic characteristics).

After the first bank layer 142, the second bank layer 144, and the third bank layer 146 are formed, dispensing devices such as first to third dispensers 180R, 180G, and 180B filled with an R-organic light-emitting material 182R, a G-organic light-emitting material 182G, and a B-organic light-emitting material 182B, respectively, are positioned on the pixel columns partitioned by the second bank layer 144 and the third bank layer 146, that is, on the R-pixel column, the G-pixel column, and the B-pixel column, and then a set amount of the organic light-emitting materials 182R, 182G, and 182B are dispensed onto each pixel column for a set time.

Here, each of the R-pixel column, the G-pixel column, and the B-pixel column is divided into a plurality of groups GR1, GR2, . . . , and GRn, and the first to third dispensers 180R, 180G, and 180B are arranged on each of the plurality of groups to respectively dispense the R-organic light-emitting material 182R, the G-organic light-emitting material 182G, and the B-organic light-emitting material 182B in each of the groups GR1, GR2, and GRn.

For example, the first dispenser 180R is arranged on each of the plurality of groups GR1, GR2, . . . , and GRn of the R-pixel column to dispense the R-organic light-emitting material 182R in each of the corresponding groups GR1, GR2, . . . , and GRn. In addition, after the first dispenser 180R is disposed on one of the plurality of groups GR1, GR2, . . . , and GRn of the R-pixel column to dispense the R-organic light-emitting material 182R in the one of the plurality of groups GR1, GR2, . . . , and GRn, the first dispenser 180R can move to on other groups GR1, GR2, . . . , and GRn to dispense the R-organic light-emitting material 182R therein. For example, the R-organic light-emitting materials 182R can be simultaneously dispensed or sequentially dispensed in the plurality of groups GR1, GR2, . . . , and GRn of the R-pixel column.

In addition, the G-organic light-emitting materials 182G and the B-organic light-emitting materials 182B can also be simultaneously dispensed or sequentially dispensed in the plurality of groups GR1, GR2, . . . , and GRn of the G-pixel column and the plurality of groups GR1, GR2, . . . , and GRn of the B-pixel column by the second dispenser 180G and the third dispenser 180B, respectively.

Here, a nozzle is provided at each of the first to third dispensers 180R, 180G, and 180B, and the nozzle is opened and closed for a set time so that the desired amount of organic light-emitting materials 182R, 182G, and 182B can be dispensed onto the first substrate 110. At this point, the nozzle of each of the first to third dispensers 180R, 180G, and 180B can be driven for a short time so that small drop-shaped organic light-emitting materials 182R, 182G, and 182B can be dispensed a plurality of times, or the organic light-emitting materials 182R, 182G, and 182B can be dispensed once in a predetermined amount in a dummy form. The first to third dispensers 180R, 180G, and 180B dispense the set amount of organic light-emitting materials 182R, 182G, and 182B, in which different driving times or driving frequencies are set, onto the corresponding pixel columns, respectively.

As described above, by dispensing the organic light-emitting material onto one pixel column, the organic light-emitting layer can be quickly formed even in the organic light-emitting display device 100 having a large area. In particular, in the present disclosure, since the organic light-emitting materials are dispensed for each group, the organic light-emitting layer can be formed more quickly.

Meanwhile, in the present disclosure, the device for dispensing the organic light-emitting materials 182R, 182G, and 182B onto the substrate is not limited to the above-described dispenser, but various coating devices such as a slit coater for discharging the organic light-emitting materials 182R, 182G, and 182B into the desired position through a slit, and a drop coater for dropping a certain amount of organic light-emitting materials 182R, 182G, and 182B can be used.

The organic light-emitting materials 182R, 182G, and 182B dispensed in each of the groups GR1, GR2, . . . , and GRn of the pixel columns spread along the pixel columns arranged in the first direction, and thus the organic light-emitting layer is formed in each of the groups GR1, GR2, . . . , and GRn.

As described above, the organic light-emitting layer having a uniform thickness can be formed by forming the organic light-emitting layer for each of the plurality of groups GR1, GR2, . . . , and GRn formed in the pixel column, which will be described in more detail below.

The plurality of pixels P arranged in the organic light-emitting display device can be formed to be completely separated from each other. For example, the organic light-emitting layer formed in each of the pixels P can be completely separated from the organic light-emitting layers of the other pixels P.

In the organic light-emitting display device having such a structure, when the organic light-emitting layer is formed, the organic light-emitting material in a solution state is dispensed onto each of the pixels P and then dried to form the organic light-emitting layer. For example, the organic light-emitting layer is formed by dispensing the organic light-emitting material directly onto each of all of the R, G, and B pixels using the dispensers 180R, 180G, and 180B illustrated in FIG. 5.

At this point, since a large number of pixels P are formed in the organic light-emitting display device, in order to quickly form the organic light-emitting layer, the plurality of dispensers 180R, 180G, and 180B should be provided to dispense the organic light-emitting materials onto the pixels P. In other words, in order to dispense the organic light-emitting materials onto the pixels P of different colors, the plurality of dispensers filled with the organic light-emitting materials of the same color should be prepared in addition to preparing the plurality of dispensers 180R, 180G, and 180B filled with organic light-emitting materials of different colors.

However, a variation occurs in the amount of one drop of the organic light-emitting materials dispensed from the plurality of dispensers 180R, 180G, and 180B due to the variation of nozzle shapes, the variation of opening and closing time of the nozzles, and the amount (pressure applied to the organic light-emitting material dispensed through the nozzle) of organic light-emitting material filled inside the dispenser. Due to such a variation in the amount of one drop, a difference occurs in the coated amount of the organic light-emitting material dispensed onto each of the pixels P. Accordingly, the thickness of the fabricated organic light-emitting layer is different for each pixel P, and thus each pixel of the organic light-emitting display device generates a difference in visual sensitivity, thereby causing a defect in the organic light-emitting display device.

On the other hand, in the present disclosure, the plurality of pixels P in the pixel column are grouped into one group, the organic light-emitting material is dispensed in each group, and the organic light-emitting material is spread and coated in the group, and thus a much larger amount of organic light-emitting material is dispensed in each group as compared with that dispensed in one pixel P. Accordingly, even when the variation occurs in the amount of one drop, it is possible to compensate for the variation in the amount of one drop by dispensing a large number of times, thereby minimizing the thickness variation of the organic light-emitting layer formed in each of the pixels P.

Figure 6:
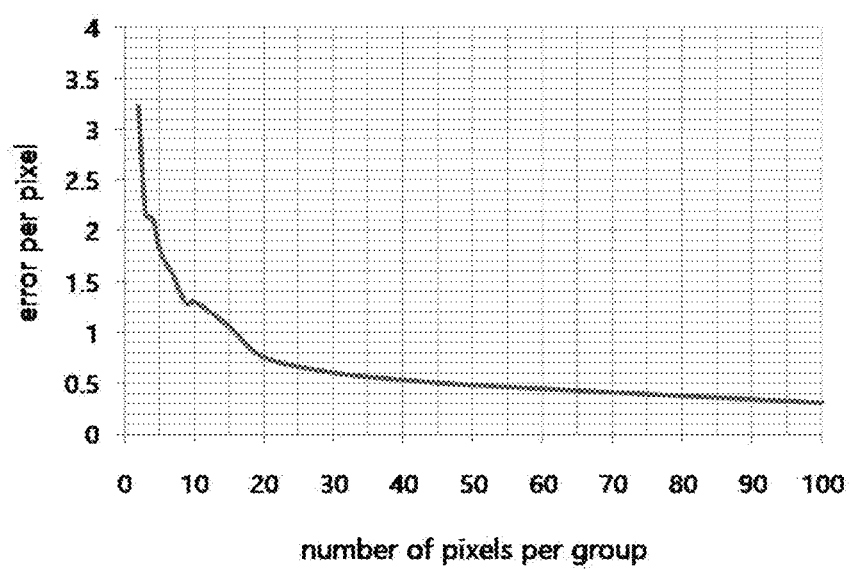
FIG. 6 is a graph illustrating an average amount of variation of an amount of the organic light-emitting material coated on one pixel versus the number of pixels included in a group.

Table 1 is a table illustrating an average amount of variation of the amount of the organic light-emitting material coated on one pixel versus the number of pixels included in each of the groups GR1, GR2, . . . , and GRn, and FIG. 6 is a graph illustrating an average amount of variation of the amount of the organic light-emitting material coated on one pixel versus the number of pixels included in each of the groups GR1, GR2, . . . , and GRn.

Here, it is assumed that the amount of one drop dispensed from one nozzle is 10.5 pl (picoliter), an error of ±10% occurs per the amount of one drop, and the organic light-emitting material is dispensed 10 times in each pixel.

TABLE 1

| Number of pixels in group | Average amount of variation (pl) per pixel | Number of pixels in group | Average amount of variation (pl) per pixel |
| --- | --- | --- | --- |
| 1 | 6.392279 | 9 | 1.280683 |
| 2 | 3.232262 | 10 | 1.307899 |
| 3 | 2.162566 | 15 | 1.063513 |
| 4 | 2.13263 | 20 | 0.759987 |
| 5 | 1.824109 | 30 | 0.607872 |
| 6 | 1.675837 | 40 | 0.53733 |
| 7 | 1.560386 | 50 | 0.486399 |
| 8 | 1.389546 | 100 | 0.311871 |

As illustrated in Table 1, when there is one pixel in the group, that is, each pixel is partitioned from the other pixels, and the organic light-emitting material is dispensed onto each pixel, the average amount of variation of the organic light-emitting material is about 6.392279 pl.

In addition, the average amount of variation is about 3.232262 pl when there are two pixels in the group, the average amount of variation is about 1.389546 pl when there are eight pixels in the group, and the average amount of variation is about 0.759987 pl when there are 20 pixels in the group, that is, as the pixels in the group increase, the average amount of variation decreases.

As illustrated in FIG. 6, as the number of pixels in the group increases from one, the average amount of variation of the organic light-emitting material initially decreases rapidly, and then the rate of the decrease in the average amount of variation decreases gradually. In particular, the average amount of variation in the pixel initially decreases rapidly until the number of pixels in the group increases up to eight and then secondly decreases rapidly until the number of pixels in the group increases up to 21. After that, when the number of pixels in the group increase from 21 to 100, the average amount of variation decreases slowly.

Accordingly, in the present disclosure, the maximum effect can be achieved by setting the number of pixels P arranged in each of the groups GR1, GR2, . . . , and GRn to eight or 21. Of course, for example, the number of pixels of each of the groups GR1, GR2, . . . , and GRn can be 10, 11, 40, or 60, but at this time, a dramatic decrease in the average amount of variation in the organic light-emitting materials may not be expected as compared with the case in which the number of pixels of each of the groups GR1, GR2, and GRn is eight or 21.

Meanwhile, as the number of pixels included in each of the groups GR1, GR2, and GRn increases, the variation in the dispensing amount of the organic light-emitting material in the pixel decreases. Accordingly, the variation in the dispensing amount of the organic light-emitting material of the pixel can be minimized by forming the entire pixel column into one group and dispensing the amount of organic light-emitting material corresponding to the organic light-emitting layer formed in the entire pixel column, but such a structure can cause other problems as follows. For example, when the resolution of a display device is 1080P, 1080 pixels P are arranged in each pixel column formed in the longitudinal direction, and thus, the organic light-emitting material dispensed in a predetermined region is spread and coated on the entire 1080 pixels P.

In general, when a solution is coated, stress is caused by van der Waals forces of the solution. However, when the organic light-emitting material in a solution form is coated on the entire pixel column of a wide area, stress acts over the entire wide area, and thus the organic light-emitting material in an outermost region of the pixel column flows into a central region of the pixel column due to the stress so that the organic light-emitting material is coated very thinly or not even coated in the outermost region.

Furthermore, such a phenomenon becomes worse when drying organic light-emitting material, and as a result, an uncoated region in which the organic light-emitting material is not coated is generated in the outer periphery region of the pixel column, and the organic light-emitting layer is not formed in the outermost region when the organic light-emitting material is completely dried. Accordingly, a mura defect is generated in which an image is not displayed on an upper end and a lower end of a completed organic light-emitting display device.

On the other hand, in the present disclosure, the pixel column is divided into the plurality of groups GR1, GR2, . . . , and GRn by the third bank layer 146, and a much smaller number (for example, eight or 20) of pixels P(R) than the pixels P(R) of the entire pixel column are arranged in each of the groups GR1, GR2, . . . , and GRn. Accordingly, when the organic light-emitting material 182R is dispensed and coated on each of the divided groups GR1, GR2, . . . , and GRn, stress acts only on the organic light-emitting material 182R in each of the divided groups GR1, GR2, . . . , and GRn, and thus the intensity of stress becomes much smaller than in the case in which the stress acts over the entire pixel column.

Accordingly, in the groups GR1, GR2, . . . , and GRn, the organic light-emitting material in the outer periphery region of the groups GR1, GR2, . . . , and GRn does not flow into the central region of the groups GR1, GR2, . . . , and GRn due to the weak stress of the organic light-emitting material 182R, and thus the organic light-emitting material is coated over the entire area of the groups GR1, GR2, . . . , and GRn with a uniform thickness, and as a result, the organic light-emitting layer 132 having a uniform thickness can be formed over the entire pixel column and the organic light-emitting display device 100.

Figure 7A:
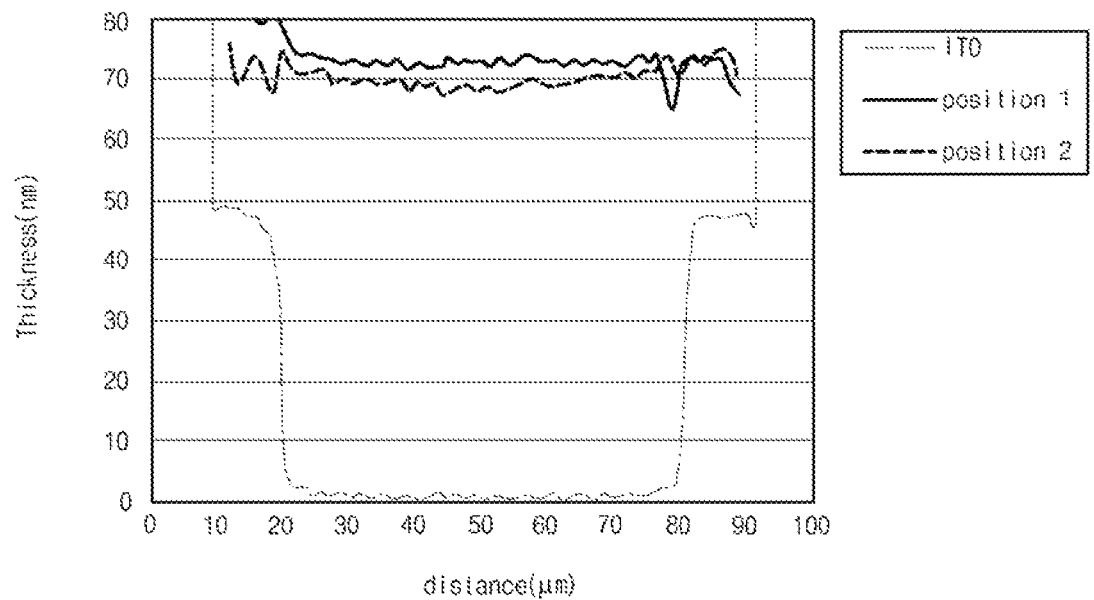
FIGS. 7A and 7B are graphs illustrating the thickness of an organic light-emitting layer measured at two specific points in one pixel column in an organic light-emitting display device, in which pixel columns are not grouped, and in the organic light-emitting display device according to the first embodiment of the present disclosure, in which pixel columns are grouped, respectively.
Figure 7B:
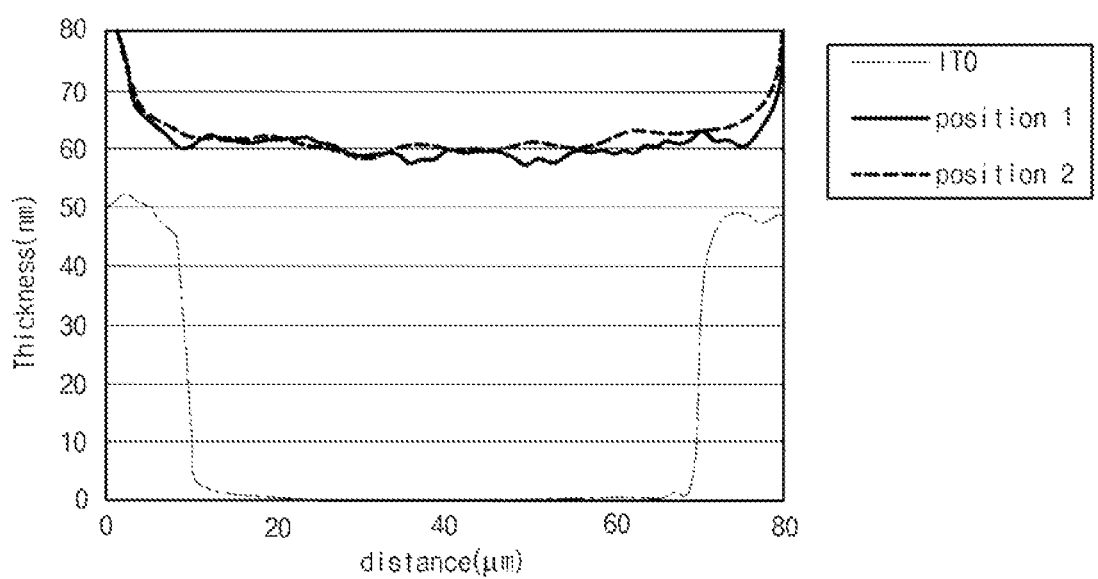

FIGS. 7A and 7B are graphs illustrating the thickness of the organic light-emitting layer measured at two specific points in one pixel column in an organic light-emitting display device in which the pixel columns are not grouped, and in the organic light-emitting display device 100 according to the first embodiment of the present disclosure, in which pixel columns are grouped, respectively. Here, a horizontal axis represents the width of the pixel (or pixel column) and a vertical axis represents the thickness of the organic light-emitting layer.

As illustrated in FIG. 7A, in the organic light-emitting display device in which the pixel columns are not grouped, a thickness difference of about 20-25 nm occurs between two points of the organic light-emitting layer over the entire width of the pixel.

On the other hand, as illustrated in FIG. 7B, in the organic light-emitting display device 100 according to the first embodiment of the present disclosure, the thicknesses of the organic light-emitting layer at two points are almost the same over the entire width of the pixel.

As described above, in the organic light-emitting display device 100 according to the first embodiment of the present disclosure, the organic light-emitting layer is formed by dispensing the organic light-emitting material in a solution state onto the plurality of pixels grouped into the groups, rather than forming the organic light-emitting layer partitioned from the organic light-emitting layers of the other pixels by dispensing the organic light-emitting material in a solution state onto each pixel. Accordingly, even when the variation occurs in the amount of one drop dispensed from the dispensing devices, since the organic light-emitting material is dispensed a large number of times corresponding to the plurality of pixels, it is possible to compensate for the variation in the dispensing amount generated during one drop, thereby minimizing the thickness variation of the organic light-emitting layer formed in each pixel.

Further, in the organic light-emitting display device 100 according to the first embodiment of the present disclosure, the pixel column is divided into the plurality of groups by forming at least one third bank layer 146 in the pixel column, and then the organic light-emitting material is dispensed in each group to form the organic light-emitting layer in each group. Accordingly, as compared with the case in which the organic light-emitting material in a solution state is dispensed on the set region of the pixel column and the organic light-emitting material is coated on the entire pixel column, the stress of the organic light-emitting material can be reduced, and thus a mura defect, which occurs because the organic light-emitting layer is not formed in the outermost region of the pixel column due to the stress, can be prevented.

As described above, the present disclosure can solve both the problem caused by forming the organic light-emitting layer in one pixel and the problem caused by forming the organic light-emitting layer in a large number of pixel columns. For example, in order to solve all the problems caused by forming the organic light-emitting layer in a large number of pixel columns, in the present disclosure, the pixel column is divided into the plurality of groups and the number of pixels included in the divided group is set to a number that can maximize the effect of reducing the variation in the drop amount so that the problem due to the variation in the drop amount and the stress of the organic light-emitting material can be effectively solved as much as possible.

Meanwhile, in the organic light-emitting display device 100 according to the first embodiment of the present disclosure, each of the groups GR1, GR2, . . . , and GRn includes eight or 21 pixels P, but the present disclosure is not limited thereto, and other numbers of pixels can be included in each of the groups GR1, GR2, . . . , and GRn depending on the variation in the dispensing amount of the dispensing device and the type of organic light-emitting material.

Further, the groups GR1, GR2, . . . , and GRn formed in each of the pixel columns of the organic light-emitting display device 100 according to the first embodiment of the present disclosure may not include the same number of pixels but can include different numbers of pixels according to regions. For example, the number of pixels P arranged in the groups (that is GR1, GR2, . . . , GRn−1, and Gn) of the outer periphery region of the pixel column can be different from the number of pixels P arranged in the groups (that is, . . . , GRn/2−1, GRn/2, and GRn/2+1, . . . ) of the central region of the pixel column.

In general, when the organic light-emitting material is coated and then dried, a drying rate is different depending on the position of the pixel column. Such a difference in the drying rate is determined by the ambient atmosphere. For example, as the drying continues to proceed, the solvent evaporates from the coated organic light-emitting material so that the ambient atmosphere of the coated organic light-emitting material is filled with an evaporation gas of the solvent having a constant concentration. Here, the solvent concentration of the atmosphere around the central region of the pixel column is high due to the continuous evaporation in the peripheral region, while the solvent concentration of the outer periphery region of the pixel column is relatively low because the evaporation occurs only on one side of the outer periphery region. Therefore, when the drying continues to proceed, the evaporation rate of the solvent, i.e., the drying rate, decreases in the central region and the drying rate increases in the outer periphery region.

The increase of the drying rate increases the density of the organic light-emitting material in a solution state, thereby increasing cohesion in the organic light-emitting material. Of course, the phenomenon in which the organic light-emitting material is not coated in the outermost region in the groups GR1, GR2, . . . , and GRn due to the cohesion of the organic light-emitting material does not occur in each of the groups GR1, GR2, . . . , and GRn divided by the third bank layer 146, and the variation in the coating thickness of the organic light-emitting material occurs little in the central region and the outer periphery region in the groups GR1, GR2, . . . , and GRn. In particular, the variation in the coating thickness of the organic light-emitting material in the group arranged in the outer periphery region of the pixel column, in which the drying rate is high, is greater than the variation in the coating thickness of the organic light-emitting material in the group arranged in the central region of the pixel column.

Accordingly, in one or more embodiments of the present invention, in consideration of the drying rate between the group of the outer periphery region of the pixel column and the group of the central region of the pixel column, the number of pixels arranged in the group of the outer periphery region is made to be smaller than that arranged in the group of the central region, thereby reducing the thickness variation due to the drying rate.

In other words, by reducing the number of pixels of the group in the outer periphery region having a high drying rate, the increase in cohesion due to the drying rate in the corresponding region is offset by the reduction of the coating area of the organic light-emitting material in a solution state, and thus, as compared with the central region, the variation in the coating thickness of the organic light-emitting material can be prevented from becoming significantly increased.

For example, two groups (for example, GR1 and GR2, and GRn−1 and GRn) of the outer periphery region of each of the upper and lower ends can be formed to include eight pixels, and the other groups (GR3, GRn–2) of the central region other than those two groups can be formed to include 21 pixels. Here, the number of pixels included in the group of the outer periphery region and the group of the central region is not limited to a specific number. In addition, the number of pixels grouped continuously or discontinuously can be increased from the outer periphery toward the central region.

Figure 8:
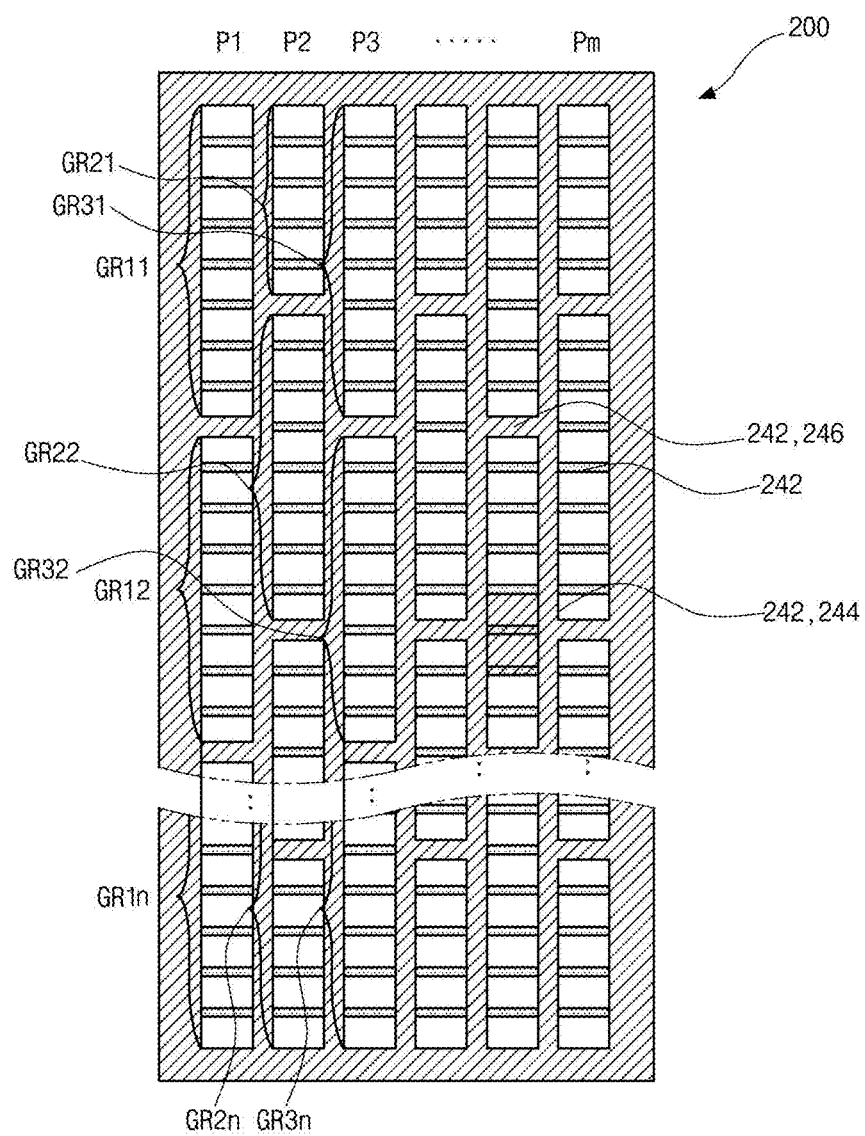
FIG. 8 is a plan view of an organic light-emitting display device according to a second embodiment of the present disclosure.

FIG. 8 is a plan view of an organic light-emitting display device 200 according to a second embodiment of the present disclosure. As illustrated in FIG. 8, in the organic light-emitting display device 200 of the present embodiment, the arrangement of pixels included in a group can be formed differently according to pixel columns P1, P2, P3, . . . , and Pm. For example, eight pixels are disposed in each of a plurality of groups GR11, GR12, and GR1n arranged in odd-numbered pixel columns (P1, P3, . . . ), and five, eight, eight, . . . , eight, and four pixels are respectively disposed in each of a plurality of groups GR21, GR22, . . . , and GR2n arranged in even-numbered pixel columns (P2, P4 . . . ) so that third bank layers 246 arranged on boundaries between the plurality of groups GR11, GR12, . . . , and GR1n can be formed so as not to be adjacent to the third bank layers 246 arranged on boundaries between the plurality of groups GR21, GR22, . . . , and GR2n in adjacent pixel column, in a transverse direction. For example, the third bank layer 246 of one pixel column can be arranged to be misaligned from the third bank layer 246 of another pixel column adjacent in the traverse direction.

In addition, according to the pixel columns P1, P2, P3, . . . , and Pm, the number of pixels included in the group can be formed differently. For example, the groups corresponding to the pixel columns of different colors can include different numbers of pixels. For example, each of the plurality of groups GR11, GR12, . . . , and GR1n formed in a first pixel column P1 can include eight pixels, each of a plurality of groups GR21, GR22, and GR2n formed in a second pixel column P2 can include four pixels, and each of a plurality of groups GR31, GR32, . . . , and GR3n formed in a third pixel column P3 can include eight pixels, and such a form of the pixel column can be repeated.

Here, the number of pixels included in each of the groups arranged in each of the pixel columns P1, P2, P3, . . . , and Pm is not limited to a specific number of eight, four, and eight, but can be formed in various numbers. When the graph of the variation in the dispensing amount illustrated in FIG. 6 is considered, the number of pixels included in each of the groups arranged in each of the pixel columns P1, P2, P3, . . . , and Pm can be limited to eight or 21.

Each of R, G, and B organic light-emitting layers are formed in each of the pixel columns P1, P2, P3, . . . , and Pm. For example, organic light-emitting layers of different colors are formed in the pixel columns that are adjacent to each other. The R, G, and B organic light-emitting materials include different kinds of phosphors or phosphorescent materials as well as different host materials and dopants. Accordingly, since the organic light-emitting materials of different colors have different components, the cohesion of the organic light-emitting materials of different colors is also different.

In the organic light-emitting display device 200 of the present embodiment, the arrangement of the groups included in each of the pixel columns P1, P2, P3, . . . , and Pm to be coated or the number of groups are set differently according to the cohesion of the R, G, and B organic light-emitting materials so that the organic light-emitting layer having a uniform thickness can always be formed.

Figure 9A:
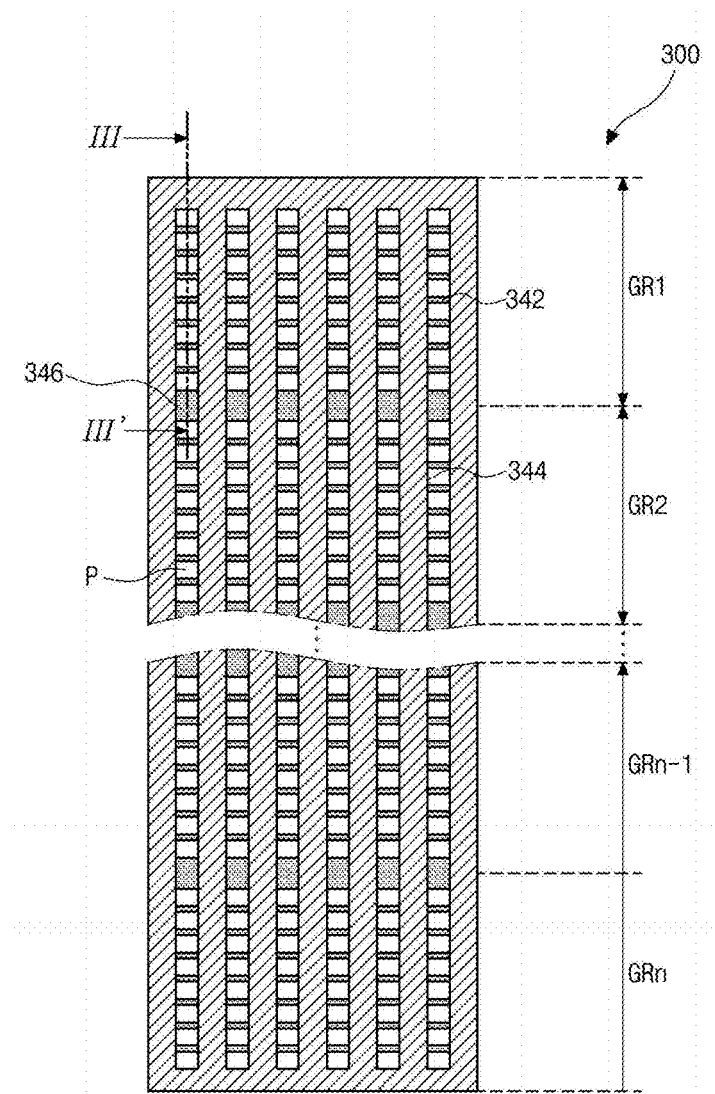
FIGS. 9A and 9B are a plan view and a cross-sectional view, respectively, of an organic light-emitting display device according to a third embodiment of the present disclosure.
Figure 9B:
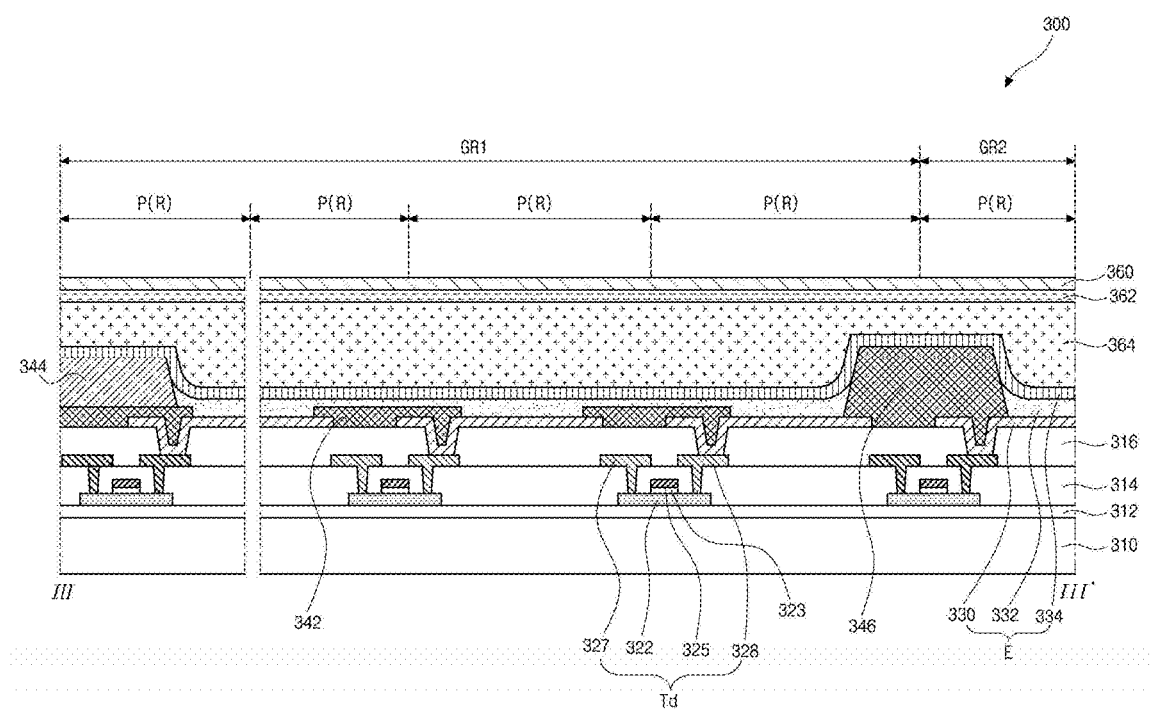

FIGS. 9A and 9B are a plan view and a cross-sectional view, respectively, illustrating a structure of an organic light-emitting display device 300 according to a third embodiment of the present disclosure. Here, the same structures as those of the organic light-emitting display device 100 of the first embodiment described with reference to FIG. 3 will be omitted or simply described, and only different structures will be described in detail.

As illustrated in FIG. 9A, a plurality of R pixels, a plurality of G pixels, and a plurality of B pixels are arranged in the organic light-emitting display device 300 according to the third embodiment of the present disclosure, and an R-organic light-emitting layer, a G-organic light-emitting layer, and a B-organic light-emitting layer are formed in the R pixel, the G pixel, and the B pixel, respectively. Here, the R pixels, the G pixels, and the B pixels are arranged in a strip manner, and the plurality of R pixels, the plurality of G pixels, and the plurality of B pixels are each arranged in a longitudinal direction.

A first bank layer 342 is formed at an outer periphery of each of the R pixels, the G pixels, and the B pixels so that each of all of the R pixels, the G pixels, and the B pixels is partitioned from the other pixels. In addition, second bank layers 344 are disposed in boundaries between R, G, and B pixel columns arranged in the longitudinal direction and an outermost region of the organic light-emitting display device 300 to partition pixel columns of different colors.

Although the first bank layers 342 are formed in boundaries between the pixels of the same color arranged along the pixel column to partition adjacent pixels of the same color, the organic light-emitting layer of the corresponding color is formed over the entire pixels arranged in the corresponding pixel column beyond the first bank layers 342.

Each of the plurality of pixel columns is partitioned into a plurality of groups GR1, GR2, . . . , and GRn, and a third bank layer 346 is formed in boundaries between the groups GR1, GR2, . . . , and GRn. Here, the third bank layer 346 is made of a hydrophilic material that is the same material as the first bank layer 342. For example, in the first embodiment described with reference to FIG. 2, the third bank layer 146 is made of a hydrophobic material, whereas in the present embodiment, the third bank layer 346 is made of a hydrophilic material.

The third bank layer 346 divides the organic light-emitting layer formed in each of the plurality of adjacent groups GR1, GR2, . . . , and GRn. For example, the organic light-emitting layer having the same color is formed in the entire pixel column, and the organic light-emitting layer is continuously formed in a plurality of pixels, which are arranged in each of the groups GR1, GR2, . . . , and GRn, beyond the first bank layers 342, but the organic light-emitting layers are formed by being disconnected from each other between adjacent groups GR1, GR2, . . . , and GRn.

As illustrated in FIG. 9B, in the organic light-emitting display device 300 of the present embodiment, the third bank layer 346 configured to divide the pixel column into the plurality of groups GR1, GR2, . . . , and GRn is made of a hydrophilic material. In the organic light-emitting display device 100 of the first embodiment, the third bank layer 146 is made of a hydrophobic material and is formed on the hydrophilic first bank layer 142, whereas in the present embodiment, the third bank layer 346 is made of a hydrophilic material and is directly formed on a protective layer 316. Here, a height of the third bank layer 346 can be greater than that of the first bank layer 342. The height of the third bank layer 346 can be less than that of the second bank layer 344. In addition, a width of an upper surface of the third bank layer 346 can be less than a width of an upper surface of the second bank layer 344.

As described above, in the present embodiment, the organic light-emitting layer can be coated on each of the groups GR1, GR2, . . . , and GRn by dividing the pixel column into the plurality of groups GR1, GR2, . . . , and GRn by the third bank layer 346, coating an organic light-emitting material on each of the plurality of groups GR1, GR2, . . . , and GRn, and allowing the organic light-emitting material to spread in each of the groups GR1, GR2, . . . , and GRn. Accordingly, non-uniformity of the thickness of the organic light-emitting material due to a variation in the amount of one drop and stress of the organic light-emitting material can be solved.

In particular, in the present embodiment, the third bank layer 346 is made of a hydrophilic material, the height of the third bank layer 346 is less than the height of the second bank layer 344, and the width of the upper surface of the third bank layer 346 is less than the width of the upper surface of the second bank layer 344. Accordingly, although the coated organic light-emitting material is not spread to the pixels of other colors beyond the second bank layer 344, the organic light-emitting material of the corresponding color can flow to another group beyond the third bank layer 346 in the pixel column of the same color.

Accordingly, since a small amount of organic light-emitting material flows between adjacent groups, some of the organic light-emitting material is spread from the group to which the greater amount of the organic light-emitting material was coated to the group to which the smaller amount of the organic light-emitting material was coated in the adjacent groups so that the non-uniformity of the thickness of the organic light-emitting material between the pixels of the corresponding pixel column can be solved more efficiently.

Figure 10A:
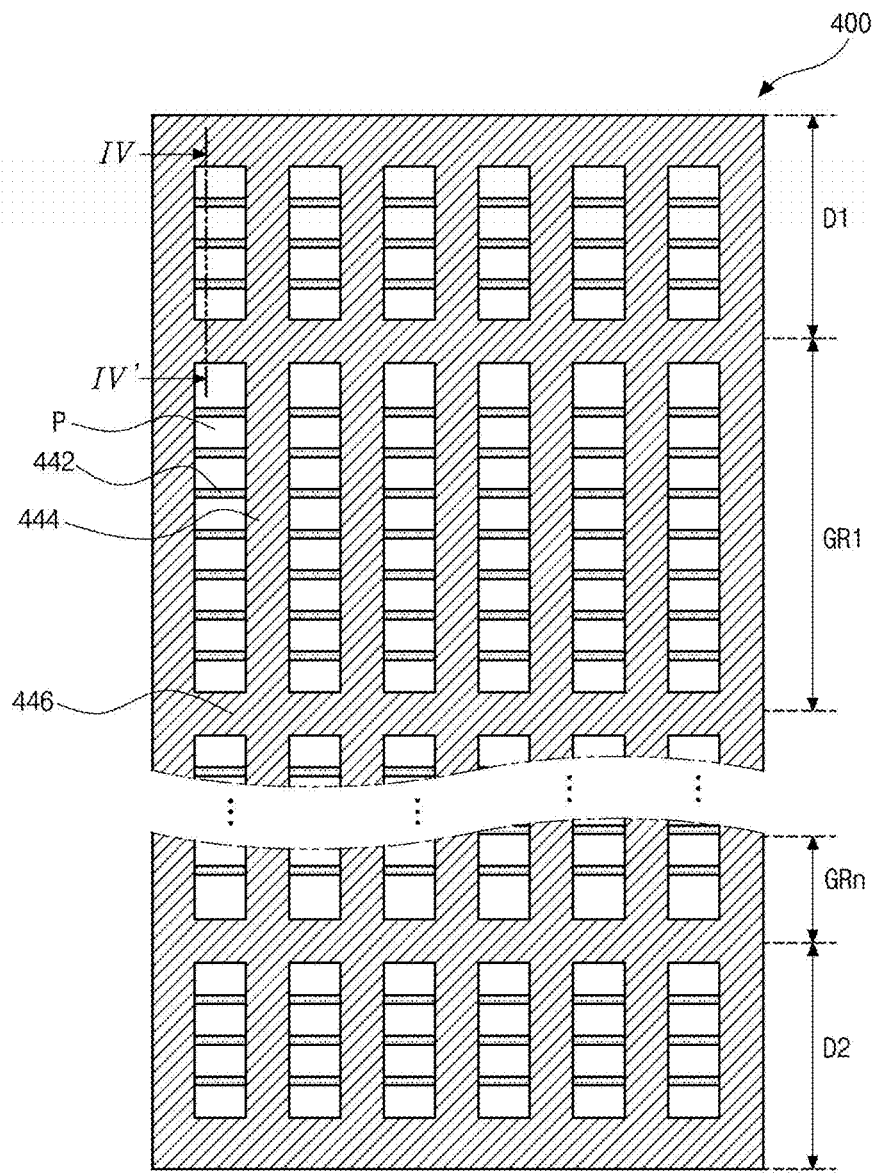
FIGS. 10A and 10B are a plan view and a cross-sectional view, respectively, of an organic light-emitting display device according to a fourth embodiment of the present disclosure.
Figure 10B:
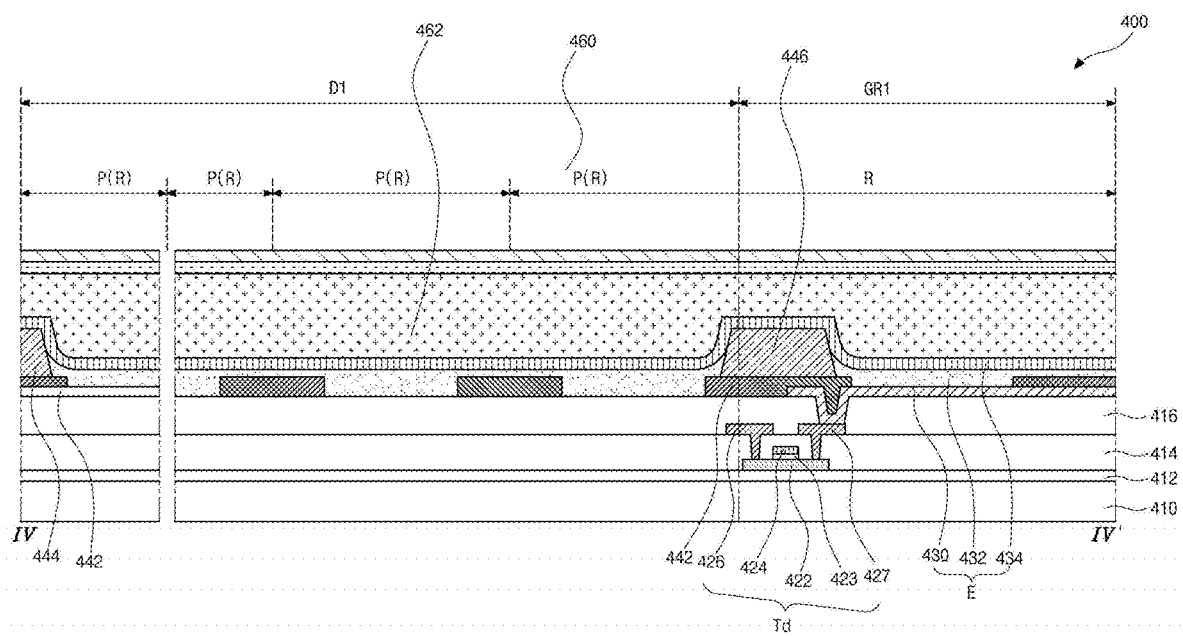

FIGS. 10A and 10B are a plan view and a cross-sectional view, respectively, of an organic light-emitting display device 400 according to a fourth embodiment of the present disclosure.

As illustrated in FIG. 10A, the organic light-emitting display device 400 according to the present embodiment includes a plurality of pixels P, and the pixels P of the same color are arranged in a longitudinal direction in a strip shape. Here, each of the pixels P is partitioned from the other pixels by a first bank layer 442 having hydrophilicity, and pixel columns of the different color are partitioned from each other by second bank layers 444. In addition, third bank layers 446 are formed in the pixel columns of the same color to divide each of the pixel columns into a plurality of groups GR1, GR2, . . . , and GRn. Here, although eight or 21 pixels P can be arranged in each of the groups GR1, GR2, . . . , and GRn, more or fewer pixels P can be arranged.

Dummy regions D1 and D2 are formed at outer peripheries of outermost groups GR1 and GRn of the pixel columns. Accordingly, in the organic light-emitting display device 400 of the present embodiment, the dummy regions D1 and D2 are disposed on the actual outermost regions of the pixel columns. Here, the second bank layer 444 is formed in the outermost region of the dummy regions D1 and D2, and the third bank layer 446 is formed in boundaries between the dummy region D1 and the outermost group GR1 and between the dummy region D2 and the outermost group GRn to define the dummy regions D1 and D2.

A plurality of dummy pixels DP are arranged in the dummy regions D1 and D2, and the first bank layer 442 is formed between the dummy pixels DP in the dummy regions D1 and D2 to partition the dummy pixels DP. Although a specific number of dummy pixels DP are illustrated in the drawings as being disposed in the dummy regions D1 and D2, the number of the dummy pixels DP is not limited to such a specific number. For example, the number of dummy pixels DP arranged in the dummy regions D1 and D2 can be the same as or different from the number of pixels P arranged in the groups GR1, GR2, . . . , and GRn.

As illustrated in FIG. 10B, the organic light-emitting display device 400 according to the present embodiment includes a group GR1 including a plurality of pixels P and the dummy region D1 disposed on an outer periphery of the group GR1 and having a plurality of dummy pixels DP arranged therein. Here, the first bank layers 442 are formed between the pixels P in the group GR1 and between the dummy pixels DP in the dummy region D1, and the second bank layers 444 are formed on the first bank layers 442 in boundaries between the pixel columns of the different color and in the outermost portion of the pixel column. The third bank layer 446 is formed on the first bank layer 442 between the dummy region D1 and the group GR1.

Here, the first bank layer 442 is made of a hydrophilic material, and the second bank layer 444 and the third bank layer 446 are made of a hydrophobic material. The second bank layer 444 and the third bank layer 446 can be integrally formed by the same process or can be formed separately by different processes.

The pixel column is also divided into the plurality of groups GR1, GR2, . . . , and GRn in the organic light-emitting display device 400 of the present embodiment, and the organic light-emitting material is dispensed in each of the groups GR1, GR2, . . . , and GRn to be spread and coated in each of the groups GR1, GR2, . . . , and GRn so that the organic light-emitting material can be entirely coated with a uniform thickness.

Since the dummy region D1 is not a region in which an image is actually implemented, a driving thin-film transistor Td and a light-emitting element E are formed in each of the plurality of pixels P in the group GR1, while the driving thin-film transistor Td and a first electrode 430 are not formed in the dummy pixel DP of the dummy region D1.

However, an organic light-emitting layer 432 is formed in the dummy pixel DP of the dummy region D1. This is to make drying conditions of an outer periphery region (that is, the groups GR1 and GRn of the outer periphery region) and a central region of the pixel column the same when the organic light-emitting layer 432 is dried. For example, by coating the organic light-emitting material on the dummy pixels DP, the organic light-emitting material is evaporated in the groups GR1 and GRn in the outer periphery region when the organic light-emitting material is dried, and thus the atmosphere of the groups GR1 and GRn in the outer periphery region, that is, the solvent concentration in upper and lower regions becomes the same as the atmosphere in a central region, and the drying rate of the organic light-emitting material in the outer periphery region and the central region of the pixel column is the same so that the organic light-emitting layer having a more uniform thickness can be formed in the outer periphery region and the central region of the pixel column.

In the dummy region D1, a second electrode 434 is formed, but the second electrode 434 may not be formed. In addition, both the driving thin-film transistor Td and the light-emitting element E can be formed in the dummy region D1, but in this case, the driving thin-film transistor Td and the light-emitting element E are not driven.

Figure 11:
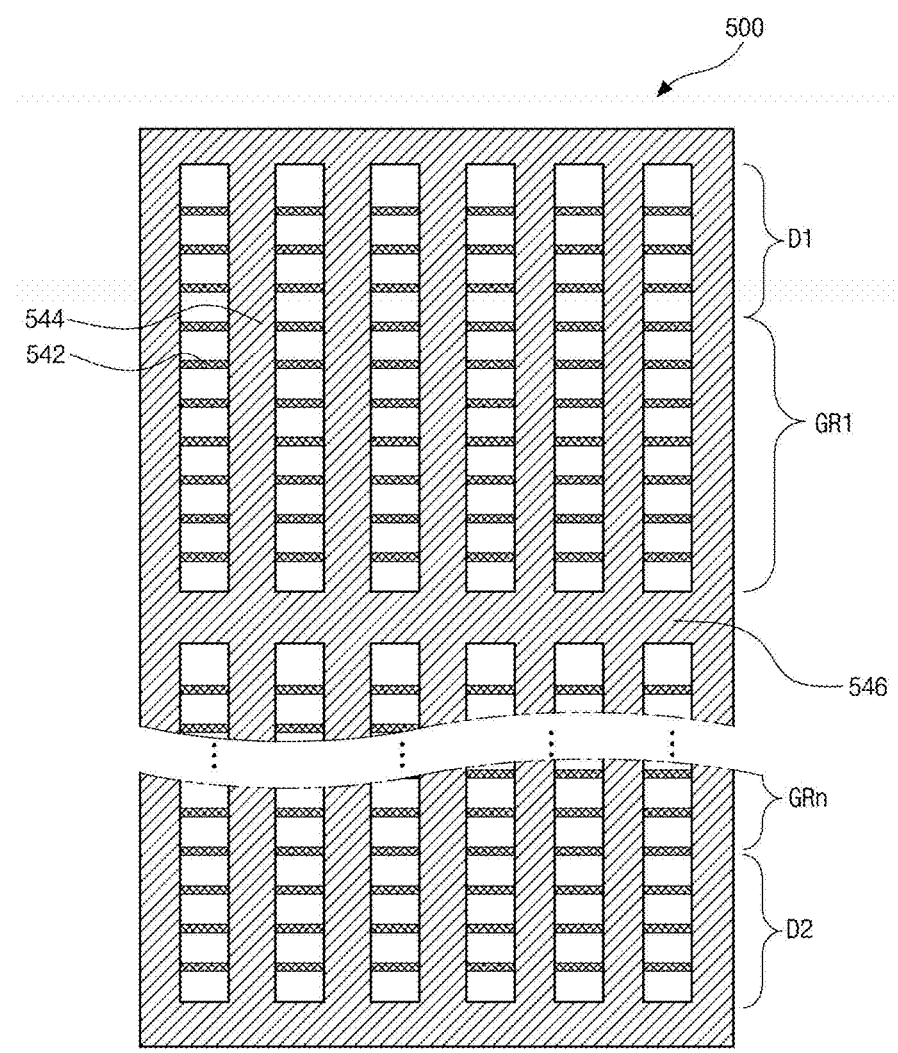
FIG. 11 is a plan view illustrating a structure of an organic light-emitting display device according to a fifth embodiment of the present disclosure.

FIG. 11 is a view illustrating an organic light-emitting display device 500 according to a fifth embodiment of the present disclosure.

Similar to the structure illustrated in FIG. 10A, the organic light-emitting display device 500 having the present structure as shown in FIG. 11 includes pixel columns each including a plurality of groups GR1, GR2, . . . , and GRn, and dummy regions D1 and D2 of outer peripheries of the pixel columns. Here, in the organic light-emitting display device 500 having the present structure, in a boundary between the dummy regions D1 and D2 and outermost groups GR1 and GRn, only a first bank layer 542 is formed and a third bank layer 546 is not formed.

Even in this structure, since only an organic light-emitting layer is formed in the dummy regions D1 and D2 but a thin-film transistor and an electrode are not formed in the dummy regions D1 and D2, when the organic light-emitting material is coated and dried, the drying rate in the outermost groups GR1 and GRn can be made the same as that in a central region by making the drying atmosphere of the outermost groups GR1 and GRn the same as the drying atmosphere of the central region.

Further, in the organic light-emitting display device 500 having the present structure, since the third bank layer 546 is not disposed in the boundary between the dummy regions D1 and D2 and the outermost groups GR1 and GRn, the organic light-emitting material dispensed in the outermost groups GR1 and GRn is spread to the dummy regions D1 and D2. Accordingly, when the thickness of the organic light-emitting material coated in the outer periphery region in the outermost groups GR1 and GRn becomes smaller, or even when the organic light-emitting material is not coated due to stress of the organic light-emitting material, since such a phenomenon occurs in the dummy regions D1 and D2 in which an image is not displayed, a mura defect does not occur in the actually completed organic light-emitting display device 500.

Figure 12:
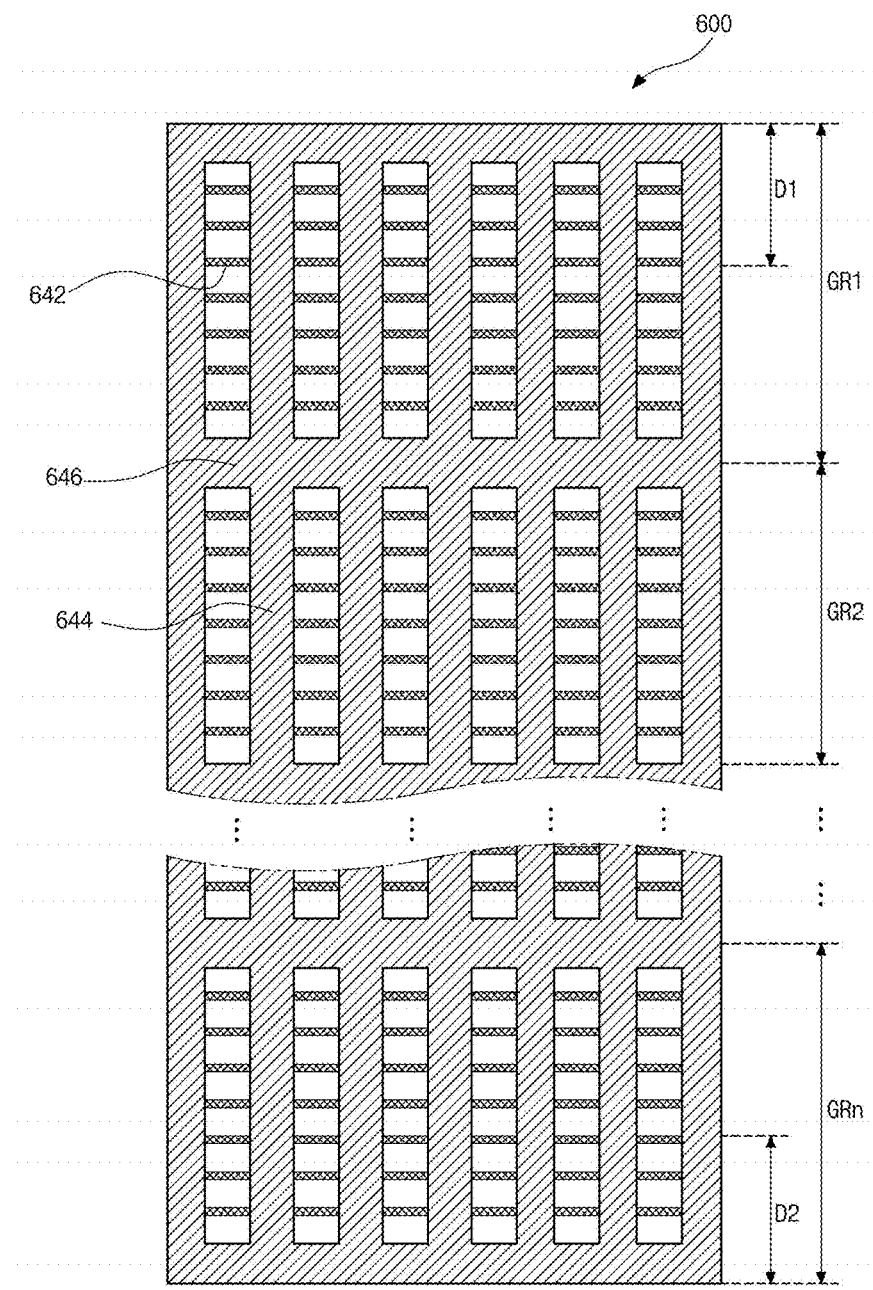
FIG. 12 is a plan view illustrating a structure of an organic light-emitting display device according to a sixth embodiment of the present disclosure.

FIG. 12 is a view illustrating an organic light-emitting display device 600 according to a sixth embodiment of the present disclosure.

Similar to the organic light-emitting display device 500 having the structure illustrated in FIG. 11, in the organic light-emitting display device 600 having the present structure of FIG. 12, a third bank layer 646 is not disposed in a boundary between dummy regions D1 and D2 and outermost groups GR1 and GRn so that an organic light-emitting material dispensed in the outermost groups GR1 and GRn is spread to the dummy regions D1 and D2.

In particular, in the organic light-emitting display device 600 having the present structure, some of the pixels P included in the outermost groups GR1 and GRn are set as the dummy regions D1 and D2 in which images are not implemented or covered by an outer case or the like. Accordingly, in the organic light-emitting display device 600 having the present structure, the number of pixels arranged in the outermost groups GR1 and GRn to implement actual images is different from the number of pixels arranged in the other groups. The sum of the number of the dummy pixels in the dummy region adjacent to an outermost group and the number of the pixels in the outermost group can be equal to the number of pixels of another group.

Even in the organic light-emitting display device 600 having the present structure, when the thickness of the organic light-emitting material coated in the outer periphery region in the outermost groups GR1 and GRn becomes smaller, or even when the organic light-emitting material is not coated due to stress of the organic light-emitting material, since the region in which such a phenomenon occurs is a region in which images are not implemented or a region that is blocked by an outer case, the mura defect does not occur in the actually completed organic light-emitting display device 600.

Although thin-film transistors and light-emitting elements are formed in dummy pixels DP of the dummy regions D1 and D2, it is possible to prevent images from being implemented in the dummy regions D1 and D2 by not applying signals to the thin-film transistors and the light-emitting elements or by disconnecting electrodes.

In addition, although the signals are applied to the thin-film transistors and the light-emitting elements of the dummy pixels DP in the dummy regions D1 and D2, it is possible to prevent the images of the dummy regions D1 and D2 from being displayed on a screen of the completed organic light-emitting display device by blocking the dummy regions D1 and D2 with an outer case.

In the present disclosure, since an organic light-emitting material is coated using a coating method, not a thermal deposition method, to form an organic light-emitting layer, processes can be performed quickly, fabricating costs can be reduced, and an organic light-emitting display device with a large area can be fabricated.

Further, in the present disclosure, since each of pixel columns is divided into a plurality of groups each including a plurality of pixels, and an organic light-emitting material in a solution state is dispensed in each of the groups, even when a variation in a dispensing amount occurs in one drop, the variation in the dispensing amount can be compensated for by dispensing a large amount of organic light-emitting material onto the plurality of pixels. Accordingly, the organic light-emitting layer can be prevented from being formed with a non-uniform thickness due to the variation in the amount of one drop.

In addition, an organic light-emitting layer can be prevented from being formed with a non-uniform thickness due to the stress of an organic light-emitting material by configuring the number of pixels included in one group such that the stress does not occur in the organic light-emitting material in a solution state.

Although many items are specifically described in the above description, this should be construed as an illustration of the exemplary embodiment rather than limiting the scope of the disclosure. Accordingly, the disclosure is not to be defined by the described embodiments but by the claims and their equivalents.

What is claimed is:

1. An organic light-emitting display device comprising:
   a plurality of first bank layers disposed on a substrate in a first direction and a second direction different from the first direction to define a plurality of pixels;
   a plurality of second bank layers disposed on the first bank layers in the first direction to partition pixel columns of different colors; and
   a third bank layer formed in each of the pixel columns in the second direction to divide each of the pixel columns into a plurality of groups each including a plurality of the pixels,
   wherein the third bank layer is disposed on the first bank layers in the second direction, and the second bank layers and the third bank layer have a smaller width than the first bank layers.

2. The organic light-emitting display device of claim 1, further comprising:
   a thin-film transistor disposed on the substrate; and
   a light-emitting element disposed on the substrate.

3. The organic light-emitting display device of claim 2, wherein the light-emitting element includes:
a first electrode and a second electrode; and
an organic light-emitting layer disposed between the first electrode and the second electrode.

4. The organic light-emitting display device of claim 3, wherein the organic light-emitting layer is continuously disposed between the plurality of pixels within the group and is disconnected between the plurality of groups.

5. The organic light-emitting display device of claim 1, wherein the plurality of groups disposed in each of the pixel columns include a same number of the pixels.

6. The organic light-emitting display device of claim 1, wherein the plurality of groups disposed in each of the pixel columns include a different number of the pixels.

7. The organic light-emitting display device of claim 6, wherein the number of the pixels included in the group increases from an outer periphery of each of the pixel columns toward a central portion of each of the pixel columns.

8. The organic light-emitting display device of claim 1, wherein the groups corresponding to the pixel columns of different colors include different numbers of pixels.

9. The organic light-emitting display device of claim 1, wherein the third bank layer of one pixel column is arranged to be misaligned from the third bank layer of another pixel column adjacent in the second direction.

10. The organic light-emitting display device of claim 1, wherein the first bank layers are made of a hydrophilic material, the second bank layers are made of a hydrophobic material, and the third bank layer is made of a hydrophobic material.

11. The organic light-emitting display device of claim 1, wherein the first bank layers are made of a hydrophilic material, the second bank layers are made of a hydrophobic material, and the third bank layer is made of a hydrophilic material.

12. The organic light-emitting display device of claim 1, wherein a height of the third bank layer is greater than a height of one of the first bank layers.

13. The organic light-emitting display device of claim 12, wherein the height of the third bank layer is less than a height of one of the second bank layers.

14. The organic light-emitting display device of claim 12, wherein the width of the third bank layer is less than a width of one of the second bank layers.

15. The organic light-emitting display device of claim 1, further comprising a dummy region disposed on an outermost portion of the pixel column and including a plurality of dummy pixels.

16. The organic light-emitting display device of claim 15, wherein the dummy region is partitioned from an outermost group by the third bank layer.

17. The organic light-emitting display device of claim 16, wherein a light-emitting element is not formed and an organic light-emitting layer is formed in the dummy region.

18. The organic light-emitting display device of claim 15, wherein the dummy region is partitioned from an outermost group by the first bank layers.

19. The organic light-emitting display device of claim 15, wherein a sum of the number of the dummy pixels in the dummy region adjacent to an outermost group and the number of the pixels in the outermost group is equal to the number of pixels of another group.

20. The organic light-emitting display device of claim 19, wherein a light-emitting element is disposed in the dummy region.

21. A method of fabricating an organic light-emitting display device, the method comprising:
forming a plurality of first bank layers disposed on a substrate in a first direction and a second direction different from the first direction to define a plurality of pixels, a plurality of second bank layers disposed on the first bank layers in the first direction to partition pixel columns of different colors, and a third bank layer configured to divide each of the pixel columns into a plurality of groups in the second direction;
forming a first electrode in the pixel;
dispensing an organic light-emitting material in each of the plurality of groups in each of the pixel columns and allowing the organic light-emitting material to spread over the entire region of each of the plurality of groups; and
drying the organic light-emitting material to form an organic light-emitting layer.

22. The method of claim 21, wherein the first bank layers are made of a hydrophilic material, the second bank layers are made of a hydrophobic material, and the third bank layer is made of a hydrophobic material.

23. The method of claim 21, wherein the first bank layers are made of a hydrophilic material, the second bank layers are made of a hydrophobic material, and the third bank layer is made of a hydrophilic material.

24. An organic light-emitting display device comprising:
a plurality of first bank layers disposed on a substrate in a first direction and a second direction different from the first direction to define a plurality of pixels;
a plurality of second bank layers disposed on the first bank layers in the first direction to partition pixel columns of different colors; and
a third bank layer formed in each of the pixel columns in the second direction to divide each of the pixel columns into a plurality of groups each including a plurality of the pixels,
wherein the first bank layers are made of a hydrophilic material, the second bank layers are made of a hydrophobic material, and the third bank layer is made of a hydrophobic material.

* * * * *